United States Patent
Chang et al.

(10) Patent No.: US 8,773,888 B2
(45) Date of Patent: *Jul. 8, 2014

(54) METHOD OF OPERATING SEMICONDUCTOR DEVICE INCLUDING VARIABLE RESISTANCE DEVICE

(75) Inventors: Man Chang, Seongnam-si (KR); Young-bae Kim, Seoul (KR); Chang-jung Kim, Yongin-si (KR); Myoung-jae Lee, Hwaseong-si (KR); Seong-jun Park, Seoul (KR); Ji-hyun Hur, Hwaseong-si (KR); Dong-soo Lee, Gunpo-si (KR); Chang-bum Lee, Seoul (KR); Seung-ryul Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 17 days.

This patent is subject to a terminal disclaimer.

(21) Appl. No.: 13/590,978

(22) Filed: Aug. 21, 2012

(65) Prior Publication Data

US 2013/0051125 A1 Feb. 28, 2013

Related U.S. Application Data

(63) Continuation-in-part of application No. 13/307,672, filed on Nov. 30, 2011, now Pat. No. 8,611,131.

(30) Foreign Application Priority Data

Aug. 22, 2011 (KR) .................. 10-2011-0083579

(51) Int. Cl.
    *G11C 11/00* (2006.01)
(52) U.S. Cl.
    USPC .......................... 365/148; 365/163

(58) Field of Classification Search
    USPC .................................. 365/148, 163
    See application file for complete search history.

(56) References Cited

U.S. PATENT DOCUMENTS

| 7,609,544 B2 | 10/2009 | Osada et al. |
| 7,639,522 B2 | 12/2009 | Cho et al. |
| 7,646,632 B2 | 1/2010 | Philipp et al. |

(Continued)

FOREIGN PATENT DOCUMENTS

| JP | 2006155700 A | 6/2006 |
| JP | 2009-026364 A | 2/2009 |

(Continued)

OTHER PUBLICATIONS

US Office Action dated May 15, 2013, issued in co-pending U.S. Appl. No. 13/307,672.

*Primary Examiner* — Huan Hoang
(74) *Attorney, Agent, or Firm* — Harness, Dickey & Pierce, P.L.C.

(57) ABSTRACT

According to an example embodiment, a method of operating a semiconductor device having a variable resistance device includes: applying a first voltage to the variable resistance device to change a resistance value of the variable resistance device from a first resistance value to a second resistance value that is different from the first resistance value; sensing a first current flowing through the variable resistance device to which the first voltage is applied; determining a second voltage used for changing the variable resistance device from the second resistance value to the first resistance value, based on a dispersion of the sensed first current; and applying the determined second voltage to the variable resistance device.

26 Claims, 16 Drawing Sheets

(56) References Cited

U.S. PATENT DOCUMENTS

| | | |
|---|---|---|
| 7,978,499 B2 | 7/2011 | Hosono et al. |
| 8,134,866 B2 | 3/2012 | Bae et al. |
| 8,213,213 B2 | 7/2012 | Chang et al. |
| 8,243,542 B2 | 8/2012 | Bae et al. |
| 8,320,171 B2 | 11/2012 | Park |
| 8,351,240 B2 | 1/2013 | Park et al. |
| 2008/0043513 A1 | 2/2008 | Hoenigschmid et al. |
| 2008/0062740 A1 | 3/2008 | Baek et al. |
| 2010/0188885 A1 | 7/2010 | Toda et al. |
| 2011/0051508 A1 | 3/2011 | Eleftheriou et al. |
| 2013/0058153 A1* | 3/2013 | Chang et al. .................. 365/148 |

FOREIGN PATENT DOCUMENTS

| | | |
|---|---|---|
| JP | 2010092568 A | 4/2010 |
| KR | 20050118331 A | 12/2005 |
| KR | 100755409 B1 | 9/2007 |
| KR | 10-0801082 B1 | 2/2008 |
| KR | 20080085597 A | 9/2008 |

* cited by examiner

METHOD OF OPERATING SEMICONDUCTOR DEVICE INCLUDING VARIABLE RESISTANCE DEVICE

CROSS-REFERENCE TO RELATED APPLICATIONS

This application is a continuation-in-part application claiming priority under 35 U.S.C. §120 to U.S. patent application Ser. No. 13/307,672, filed on Nov. 5, 2010, which claims priority under 35 U.S.C. §119 to Korean Patent Application No. 10-2011-0021869, filed on Mar. 11, 2011, in the Korean Intellectual Property Office. This application also claims priority under 35 U.S.C. §119 to Korean Patent Application No. 10-2011-0083579, filed on Aug. 22, 2011, in the Korean Intellectual Property Office (KIPO). The entire contents of each of the above-mentioned applications are incorporated herein by reference.

BACKGROUND

1. Field

Some example embodiments relate to a method of operating a semiconductor device, and more particularly, to a method of operating a semiconductor device including a variable resistance device.

2. Description of the Related Art

As a need for memory devices that have high storage capacity and consume less power has increased, research is being conducted into next-generation memory devices that are not only non-volatile but also do not need to be refreshed. Such a next-generation memory device is desired to have high integration characteristics similar to those of dynamic random access memory (DRAM), non-volatile characteristics similar to those of flash memory, high-speed operating characteristics similar to those of static RAM (SRAM), and so on. Recently, much attention has been paid to next-generation memory devices, such as phase change RAM (PRAM), nano floating gate memory (NFGM), polymer RAM (PoRAM), magnetic RAM (MRAM), ferroelectric RAM (FeRAM), and resistive RAM (RRAM). From among these next-generation memory devices, RRAM is based on the phenomenon that a path along which current flows is generated thus lowering electrical resistance when a sufficiently high voltage is applied to a nonconductive material. In this case, once the path is generated, the path may be canceled or regenerated by applying an adequate voltage to the nonconductive material.

SUMMARY

Some example embodiments relate to a method of operating a semiconductor device including a variable resistance device, which has improved dispersion of off current so as to increase the reliability of the semiconductor device.

According to an example embodiment, a method of operating a semiconductor device including a variable resistance device, the method including: a first operation of applying a first voltage to the variable resistance device to change a resistance value of the variable resistance device from a first resistance value to a second resistance value, the second resistance value being different from the first resistance value; a second operation of sensing a first current flowing through the variable resistance device to which the first voltage is applied; a third operation of determining whether the first current falls within a test range corresponding to a level of multi-level data; a fourth operation of, when the first current falls within the test range, determining a second voltage used to change the resistance value of the variable resistance device from the second resistance value to the first resistance value based on a dispersion of the sensed first current; a fifth operation of applying the second voltage to the variable resistance device; and a sixth operation of applying the first voltage to the variable resistance device to which the second voltage is applied.

The second resistance may be greater than the first resistance. The first resistance may be a set resistance and the second resistance may be a reset resistance.

The second operation may include applying a read voltage before sensing the first current flowing through the variable resistance device to which the first voltage is applied. The read voltage may have a magnitude that is smaller than a magnitude of the first voltage.

The third operation may include, when the first current is greater than the test range, performing the first through third operations again.

The third operation may include, when the first current is smaller than the test range, applying the second voltage to the variable resistance device to change the variable resistance device from the second resistance value to the first resistance value, and sequentially performing the first through third operations again.

The fourth operation may include comparing the dispersion of the first current with an average level of the first current.

The fourth operation may include at least one of: changing the second voltage if a difference between a sensed level of the first current and the average level of the first current is greater than a dispersion range, and maintaining the second voltage if the difference between a sensed level of the first current and the average level of the first current is smaller than the dispersion range.

The fourth operation may include at least one of: changing the second voltage to a third voltage that is greater than the second voltage if the sensed level of the first current is smaller than the average level of the first current, and changing the second voltage to a fourth voltage that is smaller than the second voltage if the sensed level of the first current is greater than the average level of the first current.

The changing of the second voltage may include changing at least one of a magnitude and a pulse width of the second voltage.

The fourth operation may include at least one of: changing the second voltage when a difference between a sensing level of the first current and an average level of the first current is greater than a dispersion range; and transmitting a data storing completion signal to a controller when the difference between the sensing level of the first current and the average level of the first current is smaller than the dispersion range.

The fourth operation may include determining the second voltage so that a variation of the second voltage increases as the dispersion of the first current increases.

The method may further include a seventh operation of sensing the first current flowing through the variable resistance device to which the first voltage is applied.

According to another example embodiment, a method of operating a semiconductor device including a variable resistance device, the method including applying a first voltage to the variable resistance device to change a resistance value of the variable resistance device from a first resistance value to a second resistance value, the second resistance value being different from the first resistance value; sensing first current flowing through the variable resistance device to which the first voltage is applied; determining a second voltage for changing the variable resistance device from the second resistance value to the first resistance value, based on a dispersion of the first current; applying the second voltage to the variable resistance device; and applying the first voltage to the variable resistance device to which the second voltage is applied.

The method may further include determining whether the first current falls within a test range corresponding to a level of multi-level data.

According to an example embodiment, a method of operating a semiconductor device including a variable resistance device, the method including: a first operation of apply a first voltage to the variable resistance device change a resistance value of the variable resistance device from a first resistance value to a second resistance value, the second resistance value being different from the first resistance value; a second operation of sensing a first current flowing through the variable resistance device to which the first voltage is applied; a third operation of determining whether the first current falls within a test range corresponding a level of multi-level data; a fourth operation of, when the first current is greater than the test range, repeating the first to third operations, when the first current is less than the test range, changing the resistance value of the variable resistance device to the first resistance value and repeating the first to third operations, and when the first current falls within the test range, determining a second voltage used to change the resistance value of the variable resistance device from the second resistance value to the first resistance value based on a dispersion of the sensed first current, applying the second voltage to the variable resistance device, and applying the first voltage to the variable resistance device to which the second voltage is applied.

The second resistance value may be greater than the first resistance value.

The first resistance may be a set resistance and the second resistance may be a reset resistance.

The variable resistance device may include a variable resistance material layer including one of a perovskite material and a transition metal oxide.

The second operation may include applying a read voltage to the variable resistance device before the sensing the first current following through variable resistance device to which the first voltage is applied. The read voltage may have a magnitude that is smaller than a magnitude of the first voltage.

The variable resistance device may include a lower electrode, an upper electrode, a variable resistance material layer between the lower electrode and the upper electrode.

The first voltage may be reset voltage for changing the variable resistance device to a high resistance state. The second voltage may be a set voltage for changing the variable resistance device to a low resistance state.

The method may further include a seventh operation of sensing the first current flowing through the variable resistance device to which the first voltage is applied.

According to an example embodiment, a variable resistance device may include a first electrode and a second electrode, a variable resistance material layer between the first and second electrodes, and a control circuit operatively connected to the variable resistance material layer. The control circuit may be configured to cause a first operation of applying a first voltage between the first and second electrodes of the variable resistance device to change a resistance value of the variable resistance device from a first resistance value to a second resistance value, the second resistance value being different from the first resistance value. The control circuit may be configured to a cause a second operation of sensing a first current flowing through the variable resistance device to which the first voltage is applied. The control circuit may be configured to cause a third operation of determining whether the first current falls within a test range corresponding to a level of multi-level data. The control circuit may be configured to cause a fourth operation of, when the first current does not fall within the test range, repeating the first to third operations, and when the first current falls within the test range, determining a second voltage used to change the resistance value of the variable resistance device from the second resistance value to the first resistance value based on a dispersion of the sensed first current, applying the second voltage between the first and second electrodes of the variable resistance device, and applying the first voltage to the variable resistance device to which the second voltage is applied.

According to an example embodiment, a memory card may include the semiconductor device and a controller operatively connected to the semiconductor device.

According to an example embodiment, an electronic system may include the semiconductor device, a processor, and a bus that operatively connects the semiconductor device to the processor.

BRIEF DESCRIPTION OF THE DRAWINGS

The foregoing and/or other features and advantages of example embodiments will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
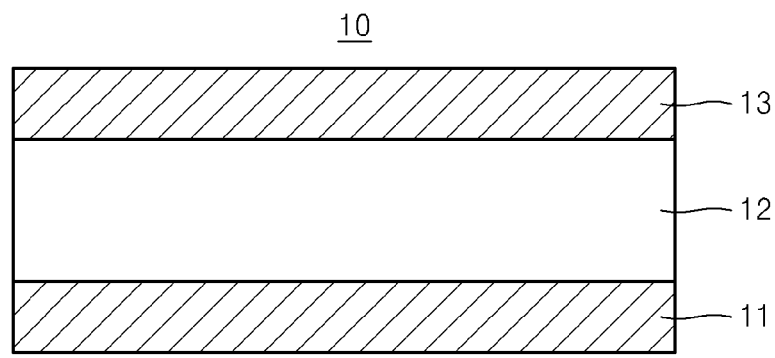
FIG. 1 is a schematic cross-sectional view of a variable resistance device according to an example embodiment.

Example embodiments will now be described more fully with reference to the accompanying drawings, in which some example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein FIG. 1 is a schematic cross-sectional diagram of a variable resistance device 10 according to an example embodiment. Referring to FIG. 1, the variable resistance device 10 may include a lower electrode 11, a variable resistance material layer 12, and an upper electrode 13. The variable resistance material layer 12 may be formed between the lower electrode 11 and the upper electrode 13. The variable resistance device 10 may further include a buffer layer (not shown) on the lower electrode 11 or on the variable resistance material layer 12.

The lower electrode 11 and the upper electrode 13 may be formed of a conductive material, for example, an oxidation resistant metal layer or a polysilicon layer. For example, the oxidation resistant metal layer may be formed of at least one of platinum (Pt), iridium (Ir), an iridium oxide (IrO), a titanium nitride (TiN), a titanium aluminum nitride (TiAlN), tungsten (W), molybdenum (Mo), ruthenium (Ru), and a ruthenium oxide (RuO). The oxidation resistant metal layer may be formed after the buffer layer is formed. The lower electrode 11 and the upper electrode 13 may be located above and below the variable resistance material layer 12, respectively, but example embodiments are not limited thereto. The lower electrode 11 and the upper electrode 13 may be located on the left and right sides of the variable resistance material layer 12, respectively.

The variable resistance material layer 12 may include a perovskite-based oxide or a transition metal oxide, but example embodiments are not limited thereto. Examples of the perovskite-based oxide include $Pr_{1-x}Ca_xMnO_3$, $La_{1-x}Ca_xMnO_3$, $SrZrO_3/SrTiO_3$, $CrTiO_3$, $Pb(Zr, Ti)O_3/Zn_{1-x}Cd_xS$, and so on. Examples of the transition metal include nickel, niobium, titanium, zirconium, hafnium, cobalt, iron, copper, manganese, zinc, chrome, and so on. Examples of the transition metal oxide include oxides of nickel, niobium, titanium, zirconium, hafnium, cobalt, iron, copper, manganese, zinc, chrome, and so on. A resistance of the variable resistance material layer 12 may vary according to the difference between voltages applied to the lower electrode 11 and the upper electrode 13.

Figure 2:
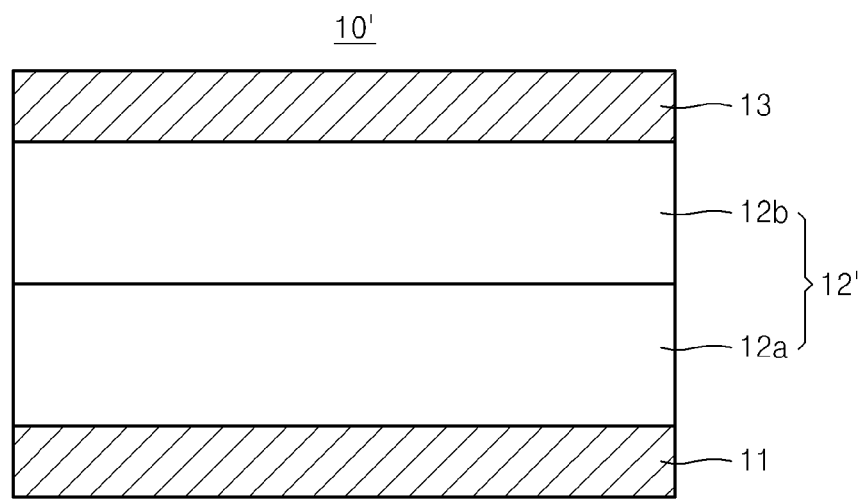
FIG. 2 is a schematic cross-sectional diagram of a variable resistance device according to another example embodiment.

FIG. 2 is a schematic cross-sectional diagram of a variable resistance device 10' according to an example embodiment.

Referring to FIG. 2, the variable resistance device 10' may include a lower electrode 11, a variable resistance material layer 12', and an upper electrode 13. The variable resistance material layer 12' may be formed between the lower electrode 11 and the upper electrode 13. The variable resistance material layer 12' may include a base thin film 12a and an oxygen exchange layer 12b. For example, the base thin film 12a may include a $TaO_x$ layer, and the oxygen exchange layer 12b may include a $Ta_2O_5$ layer, but example embodiments are not limited thereto. The variable resistance device 10' may be a modified example of the variable resistance device 10 illustrated in FIG. 1, and the variable resistance device 10 described above with reference to FIG. 1 may also be modified to incorporate features of the variable resistance device 10' illustrated in FIG. 2.

Figure 3:
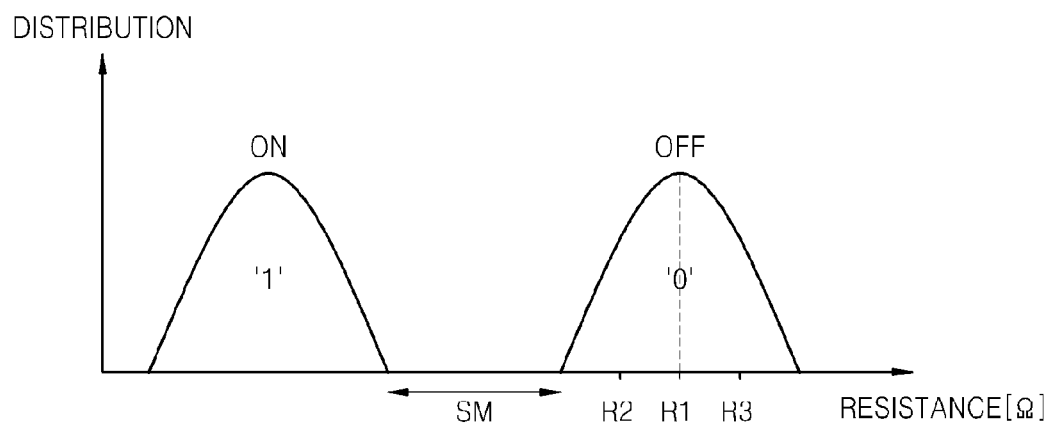
FIG. 3 is a graph schematically illustrating a distribution of resistances of a variable resistance device, according to an example embodiment.

FIG. 3 is a graph illustrating a distribution of resistance values of a variable resistance device, according to an example embodiment.

In FIG. 3, the X-axis denote a resistance of the variable resistance device and the Y-axis denote the total number of variable resistance devices. The variable resistance device may include the variable resistance device 10 of FIG. 1 or the variable resistance device 10' of FIG. 2. Hereinafter, for convenience of description, the case where the variable resistance device includes the variable resistance device 10 of FIG. 1 will be described.

The variable resistance device 10 may be used in a semiconductor device, such as a single-bit non-volatile memory device, which may memorize data '0' or '1' according to the resistance state of the variable resistance material layer 12. Alternatively, the variable resistance device 10 may be used in a semiconductor device, such as a multi-bit non-volatile memory device, which may memorize data '00', '01', '10', or '11' according to the resistance state of the variable resistance material layer 12.

Referring to FIG. 3, data '0' and data '1' may denote a high resistance state and a low resistance state. Writing data '1' to the variable resistance device may be referred to as a set operation, and writing data '0' to the variable resistance device may be referred to as a reset operation. However, example embodiments are not limited thereto. Alternatively, data '1' and data '0' may correspond to a high resistance state and a low resistance state.

The variable resistance device 10 may be 'on' when data '1' is written thereto, and may be 'off' when data '0' is written thereto. In this case, in order to improve the reliability of the variable resistance device 10 (or, a semiconductor device including the variable resistance device 10), a sufficient sensing margin SM between the 'on' state and the 'off' state of the variable resistance device 10 may need to be secured.

When the variable resistance device 10 is in the 'off' state, that is, when the variable resistance device 10 is in the high resistance state, a resistance of the variable resistance device 10 may be an off resistance $R_{OFF}$ that may be divided into first through third resistances R1, R2, and R3. In this regard, the first resistance R1 may correspond to an average value of the off resistance $R_{OFF}$, the second resistance R2 may correspond to a resistance smaller than the average value of the off resistance $R_{OFF}$, and the third resistance R3 may correspond to a resistance greater than the average value of the off resistance $R_{OFF}$. The off resistance $R_{OFF}$ of the variable resistance device 10 may have a desired (and/or alternatively predetermined) dispersion.

When the variable resistance device 10 is switched from an "off" state to the "on" state, a conductive path may be formed in the variable resistance material layer between the lower electrode 11 and the upper electrode 13. In this regard, an amount of energy necessary for changing the variable resistance device 10 from the "on" state to the "off" state may vary according to the characteristics of the conductive path formed when the variable resistance device 10 is in the "on" state, for example, sizes, number, or lengths of filament components.

More specifically, when a size of the conductive path that may be formed when the variable resistance device 10 is in the "on" state is relatively small, the amount of energy necessary for changing the variable resistance device 10 from the "on" state to the "off" state may be relatively small. Meanwhile, when the size of the conductive path that may be formed when the variable resistance device 10 is in the "on" state is relatively large, the amount of energy necessary for changing the variable resistance device 10 from the "on" state to the "off" state may be relatively large.

Figure 4:
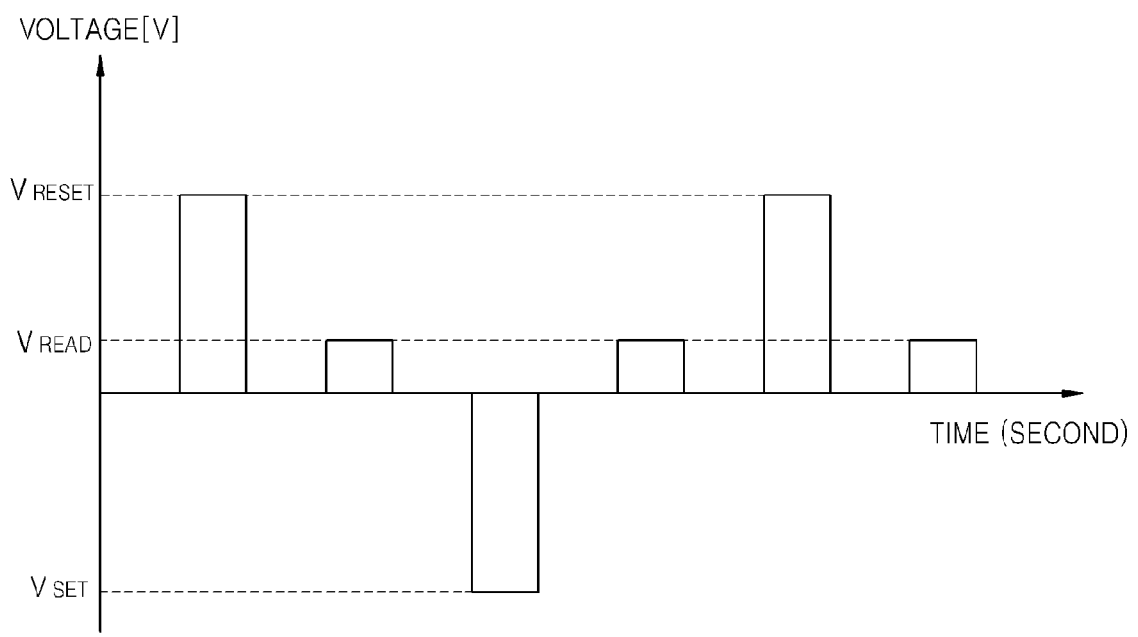
FIG. 4 is a graph showing operating voltages applied to a variable resistance device, according to an example embodiment.

FIG. 4 is a graph showing an example of operating voltages applied to a variable resistance device.

In FIG. 4, the X-axis denotes time (seconds) and the Y-axis denotes a voltage (V) applied to the variable resistance device. In the case, the variable resistance device may include the variable resistance device 10 of FIG. 1 or the variable resistance device 10' of FIG. 2. Hereinafter, for convenience of description, a case where the variable resistance device includes the variable resistance device 10 of FIG. 1 will be described. The voltage (V) that may be applied to the variable resistance device 10 may denote the difference between voltages that may be applied to the lower and upper electrodes 11 and 13 of the variable resistance device 10, and more particularly, may denote a value that may be obtained by subtracting the voltage that may be applied to the upper electrode 13 from the voltage that may be applied to the lower electrode 11.

First, a reset voltage $V_{RESET}$ may be applied to the variable resistance device 10, and a read voltage $V_{READ}$ may be applied thereto to sense a reset current $I_{RESET}$ flowing through the variable resistance device 10. In this case, the read voltage $V_{READ}$ may have a smaller magnitude than that of the reset voltage $V_{RESET}$. A cycle in which the reset voltage $V_{RESET}$ and the read voltage $V_{READ}$ are continuously applied to the variable resistance device 10, may be referred to as a reset cycle. The variable resistance device 10 may be switched from the low resistance state to the high resistance state, that is, from the 'on' state to the 'off' state when the reset voltage $V_{RESET}$ is applied thereto. In this case, little current may flow through the variable resistance device 10.

Next, a set voltage $V_{SET}$ may be applied to the variable resistance device 10 and the read voltage $V_{READ}$ may be applied thereto to sense the set current $I_{SET}$ flowing through the variable resistance device 10. A cycle in which the set voltage $V_{SET}$ and the read voltage $V_{READ}$ may be continuously applied to the variable resistance device 10, may be referred to as a set cycle. The variable resistance device 10 may be switched from the high resistance state to the low resistance state, that is, from the 'off' state to the 'on' state when the set voltage $V_{SET}$ is applied thereto. In this case, the set voltage $V_{SET}$ applied to the variable resistance device 10 may have a constant value, more particularly, a constant magnitude or a constant pulse width.

Next, the reset voltage $V_{RESET}$ may be applied to the variable resistance device 10, and the read voltage $V_{READ}$ may be applied thereto to sense the reset current $I_{RESET}$ flowing through the variable resistance device 10 again. In this case, the reset voltage $V_{RESET}$ that may be applied to the variable resistance device 10 may have a constant value, more particularly, a constant magnitude or a constant pulse width.

Here, the polarities of the reset voltage $V_{RESET}$ and the set voltage $V_{SET}$ may be opposite to each other. If the variable resistance device 10 has the reset voltage $V_{RESET}$ and the set voltage $V_{SET}$, the polarities of which are opposite to each other, then the variable resistance device 10 may be referred to as a 'bipolar variable resistance device'. In the graph of FIG. 4, the set voltage $V_{SET}$ and the reset voltage $V_{RESET}$ applied to the variable resistance device 10 may have a negative value and a positive value, respectively. However, example embodiments are not limited thereto, and the set voltage $V_{SET}$ may have the positive value and the reset voltage $V_{RESET}$ may have the negative value according to the type of material that may be used to form the variable resistance material layer 12 of the variable resistance device 10.

Figure 5:
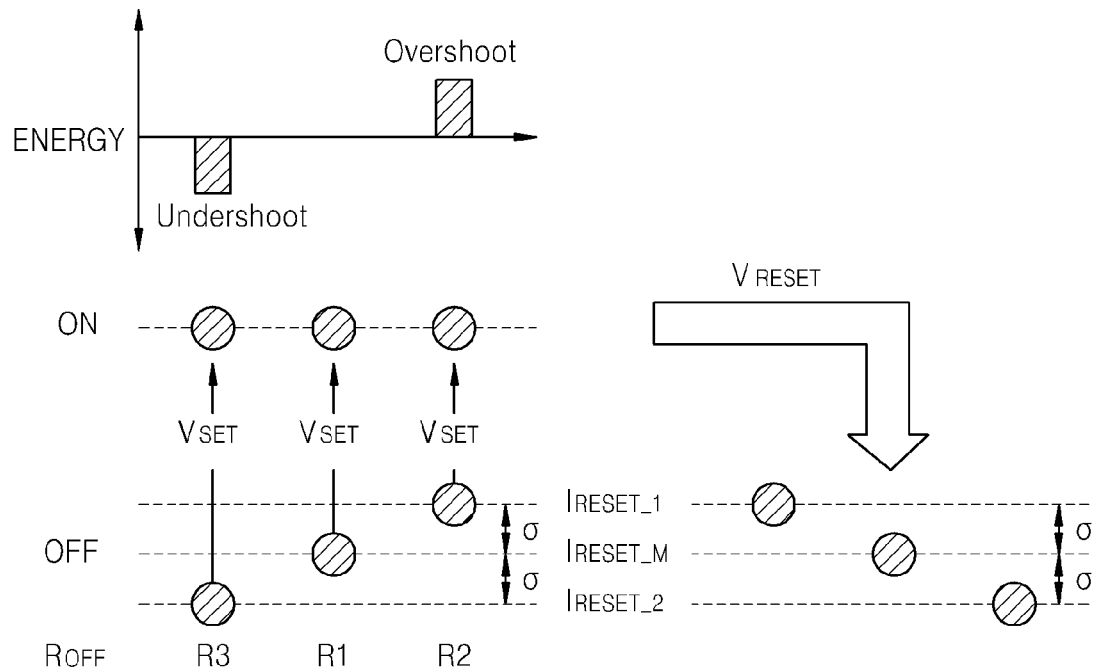
FIG. 5 is a schematic diagram for describing an operation of a variable resistance device when the operating voltages of FIG. 4 are applied thereto, according to an example embodiment.

FIG. 5 is a schematic diagram for describing an operation of the variable resistance device 10 when the operating voltages of FIG. 4 are applied thereto, according to an example embodiment.

Referring to FIG. 5, when the variable resistance device 10 is in the "off" state, the variable resistance device 10 may have the off resistance $R_{OFF}$ that may be divided into the first through third resistances R1, R2, and R3 as shown in FIG. 3. When the variable resistance device 10 has the first resistance R1, the reset current $I_{RESET\_M}$ flowing through the variable resistance device 10 may have an average level $I_{RESET\_M}$. When the variable resistance device 10 has the second resistance R2, the reset current $I_{RESET}$ flowing through the variable resistance device 10 may have a first level $I_{RESET\_1}$. In this regard, the first level $I_{RESET\_1}$ may be a level (e.g., $I_{RESET\_M+\sigma}$) that is higher than the average level $I_{RESET\_M}$ by a desired (or alternatively predetermined) level σ. When the variable resistance device 10 has the third resistance R3, the reset current $I_{RESET}$ that may be flowing through the variable resistance device 10 may have a second level $I_{RESET\_2}$. In this regard, the second level $I_{RESET\_2}$ may be a level (e.g., $I_{RESET\_M-\sigma}$) that is lower than the average level $I_{RESET\_M}$ by the desired (or alternatively predetermined) level σ.

The set voltage $V_{SET}$ may be applied to the variable resistance device 10 in order to switch the variable resistance device 10 from the "off" state to the "on" state. The set voltage $V_{SET}$ may have a constant value irrespective of the off resistance $R_{OFF}$ of the variable resistance device 10 as shown in FIG. 4. When the set voltage $V_{SET}$ having the constant value is applied to the variable resistance device 10, the characteristics of conductive paths that may be formed when the variable resistance device 10 is in the "on" state may differ from each other.

More specifically, when the off resistance $R_{OFF}$ is the second resistance R2, the reset current $I_{RESET}$ that may be flowing through the variable resistance device 10 may have the first level $I_{RESET\_1}$ that may be higher than the average level $I_{RESET\_M}$. In this regard, when the set voltage $V_{SET}$ that may be equal to the set voltage $V_{SET}$ where the off resistance $R_{OFF}$ may be the first resistance R1 or the third resistance R3 may be applied to the variable resistance device 10, the variable resistance device 10 may undergo an energy surplus compared to when the off resistance $R_{OFF}$ may be the first resistance R1 or the third resistance R3. Accordingly, an overshoot of energy may be applied to the variable resistance device 10 when the off resistance $R_{OFF}$ is the second resistance R2 compared to energy applied to the variable resistance device 10 when the off resistance $R_{OFF}$ is the first resistance R1.

Meanwhile, when the off resistance $R_{OFF}$ may be the third resistance R3, the reset current $I_{RESET}$ flowing through the variable resistance device 10 has the second level $I_{RESET\_2}$ that may be lower than the average level $I_{RESET\_M}$. In this regard, when the set voltage $V_{SET}$ that is equal to the set voltage $V_{SET}$ when the off resistance $R_{OFF}$ is the first resistance R1 or the second resistance R2 is applied to the variable resistance device 10, the variable resistance device 10 may experience a lack of energy compared to when the off resistance $R_{OFF}$ is the first resistance R1 or the second resistance R2. Accordingly, an undershoot of energy may be applied to the variable resistance device 10 when the off resistance $R_{OFF}$ is the third resistance R3 compared to energy applied to the variable resistance device 10 when the off resistance $R_{OFF}$ is the first resistance R1.

Next, the reset voltage $V_{RESET}$ may be applied to the variable resistance device 10 in order to switch the variable resistance device 10 from the "on" state to the "off" state again. The reset voltage $V_{RESET}$ may have a constant value irrespective of the off resistance $R_{OFF}$ of the variable resistance device 10 as shown in FIG. 4. When the same reset voltage $V_{RESET}$ is applied to the variable resistance device 10, the reset voltage $V_{RESET}$ flowing through the variable resistance device 10 after the reset voltage $V_{RESET}$ is applied to the variable resistance device 10 may have a resistance dispersion by the desired (or alternatively predetermined) level a that is the same as the resistance dispersion in the "off" state in a previous operation as shown in FIG. 5.

When the constant set voltage $V_{SET}$ is applied to the variable resistance device 10 irrespective of a dispersion of the off resistance $R_{OFF}$ of the variable resistance device 10, the variable resistance device 10 may generate conductive paths having different characteristics. Thus, when the variable resistance device 10 is switched from the "on" state to the "off" state again, if the constant reset voltage $V_{RESET}$ is applied to the variable resistance device 10, the reset voltage $V_{RESET}$ may have a dispersion by the desired (or alternatively predetermined) level a that may be the same as the dispersion in the reset voltage $V_{RESET}$ in a previous operation, and accordingly, the off resistance $R_{OFF}$ may have a dispersion by the desired (or alternatively predetermined) level a that may be the same as the dispersion in the off resistance $R_{OFF}$ in a previous operation.

Figure 6:
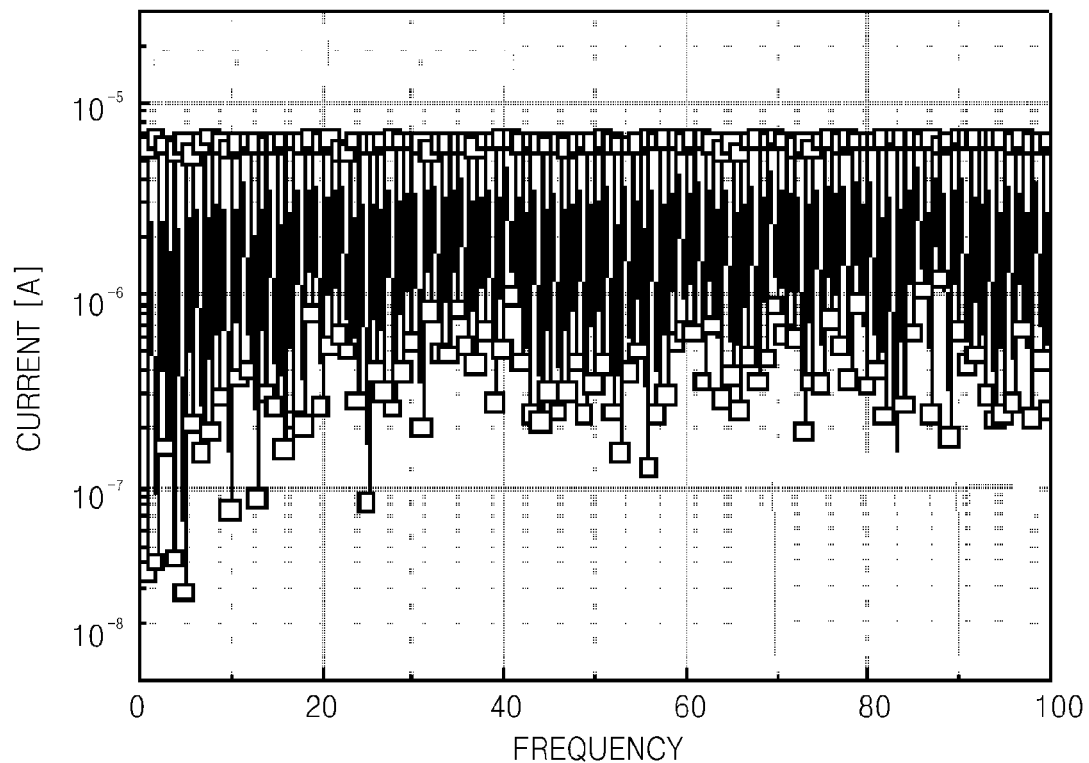
FIG. 6 is a graph showing a variation in the amount of current flowing through the variable resistance device of FIG. 1 when the operating voltages of FIG. 5 are applied thereto, according to an example embodiment.

FIG. 6 is a graph showing a variation in the amount of current flowing through the variable resistance device 10 of FIG. 1 when the operating voltages of FIG. 4 are applied thereto.

In FIG. 6, the X-axis denotes a number of times that the set cycle or the reset cycle is performed, and the Y-axis denotes the amount of current (A). In this regard, the variable resistance material layer 12 included in the variable resistance device 10 may include, for example, Tax, the reset voltage $V_{RESET}$ may be about 4.5 V, the set voltage $V_{SET}$ may be about −3.5 V, and pulse widths of the reset voltage $V_{RESET}$ and the set voltage $V_{SET}$ may be about 1 us.

Current flowing through the variable resistance device 10 after the set cycle, e.g., current may be sensed when the set voltage $V_{SET}$ and the read voltage $V_{SET}$ may be sequentially applied to the variable resistance device 10, may be referred to as set current $I_{SET}$. Also, current flowing through the variable resistance device 10 after the reset cycle, e.g., current that may be sensed when the reset voltage $V_{RESET}$ and the read voltage $V_{READ}$ may be sequentially applied to the variable resistance device 10, may be referred to as reset current $I_{RESET}$.

In FIG. 6, the set current $I_{SET}$ may be maintained at a constant current level of about 1.00E-5 A. That is, the set current $I_{SET}$ may be maintained at a constant current level regardless of the number of times that the set cycle may be performed. However, the reset current $I_{RESET}$ may have a relatively large dispersion and may be maintained at a current level of about 1.00E-8 to about 1.00E-6. In this case, the reset current $I_{RESET}$ may show a non-linear distribution regardless of the number of times that the reset cycle may be performed.

As described above, in the variable resistance device 10, the set current $I_{SET}$ may have a relatively small dispersion and the reset current $I_{RESET}$ may have a relatively large dispersion. Thus, when a sensing margin between the 'on' state and the 'off' state of the variable resistance device 10 may not be sufficiently secured, the variable resistance device 10 may be difficult to be used as a memory device.

Figure 7:
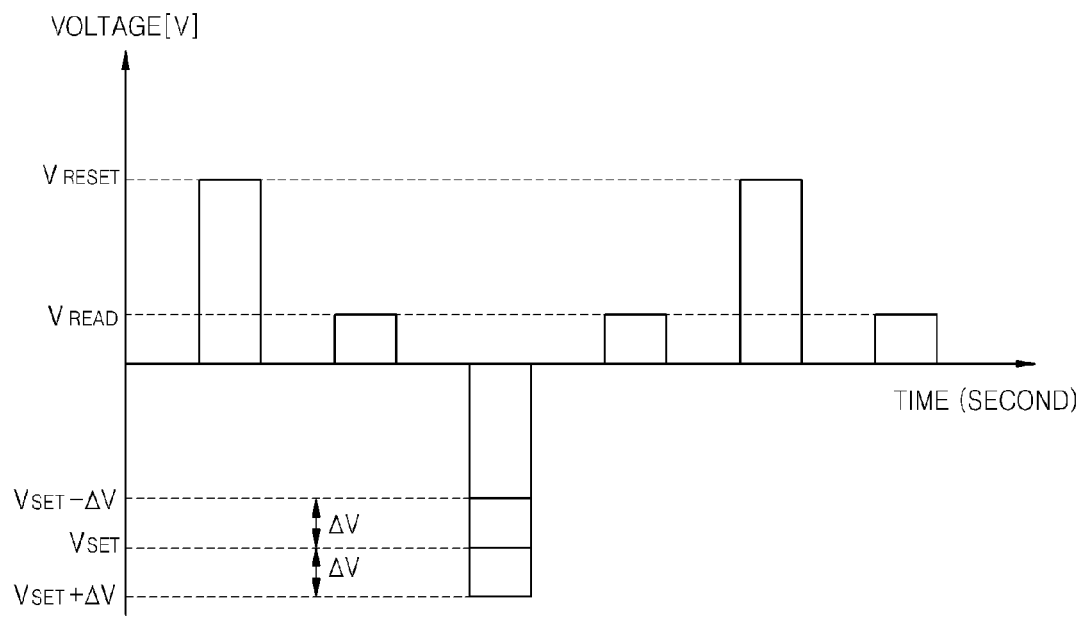
FIG. 7 is a graph showing operating voltages applied to a variable resistance device, according to another example embodiment.

FIG. 7 is a graph showing operating voltages applied to a variable resistance device, according to another example embodiment.

Referring to FIG. 7, the X-axis denotes time (seconds) and the Y-axis denotes a voltage (V) that may be applied to the variable resistance device 10. The variable resistance device may include the variable resistance device 10 of FIG. 1 or the variable resistance device 10' of FIG. 2. For descriptive convenience, the variable resistance device may include the variable resistance device 10 of FIG. 1. The voltage (V) that may be applied to the variable resistance device 10 may denote the difference between voltages that may be applied to the lower and upper electrodes 11 and 13 of the variable resistance device 10, and more particularly, a value that may be obtained by subtracting the voltage that may be applied to the upper electrode 13 from the voltage applied to the lower electrode 11.

First, the reset voltage $V_{RESET}$ may be applied to the variable resistance device 10, and the read voltage $V_{READ}$ may be applied thereto to sense a reset current $I_{RESET}$ flowing through the variable resistance device 10. The read voltage $V_{READ}$ may have an absolute magnitude smaller than that of the reset voltage $V_{RESET}$. The variable resistance device 10 may be switched from a low resistance state to a high resistance state, e.g., the variable resistance device 10 may be switched from an "on" state to an "off" state, when the reset voltage $V_{RESET}$ may be applied thereto. In this case, little current may flow through the variable resistance device 10.

Next, the set voltage $V_{SET}$ may be applied to the variable resistance device 10, and the read voltage $V_{READ}$ may be applied thereto to sense a set current $I_{SET}$ flowing through the variable resistance device 10. The read voltage $V_{READ}$ may have an absolute magnitude smaller than that of the set voltage $V_{SET}$. The variable resistance device 10 may be switched from the high resistance state to the low resistance state, e.g., the variable resistance device 10 may be switched from the "off" state to the "on" state, when the set voltage $V_{SET}$ may be applied thereto. In this case, current may flow through the variable resistance device 10.

The set voltage $V_{SET}$ that may be applied to the variable resistance device 10 may have a variable value, in particular, a variable absolute value or a variable pulse width, according to a dispersion of the reset current $I_{RESET}$ flowing through the variable resistance device 10 in the "off" state in a previous operation, e.g., according to a dispersion of the off resistance $R_{OFF}$ of the variable resistance device 10.

In particular, the higher the off resistance $R_{OFF}$ in the previous operation, the smaller the value of the reset current $I_{RESET}$, and thus a relatively large amount of energy may be necessary for switching the variable resistance device 10 from the "off" state to the "on" state. In this case, the set voltage $V_{SET}$ may be determined to have a relatively large value, e.g., a relatively large absolute value or pulse width.

Meanwhile, the lower the off resistance $R_{OFF}$ in the previous operation, the greater the value of the reset current $I_{RESET}$ may be, and thus a relatively small amount of energy may be necessary for switching the variable resistance device 10 from the "off" state to the "on" state. In this case, the set voltage $V_{SET}$ may be determined to have a relatively small value, e.g., a relatively small absolute value or pulse width.

Next, the reset voltage $V_{RESET}$ may be again applied to the variable resistance device 10, and the read voltage $V_{READ}$ may be applied thereto to sense the reset current $I_{RESET}$ flowing through the variable resistance device 10. In this regard, the reset voltage $V_{RESET}$ that may be applied to the variable resistance device 10 may have a constant value, in particular, a constant absolute value or a constant pulse width.

Figure 8:
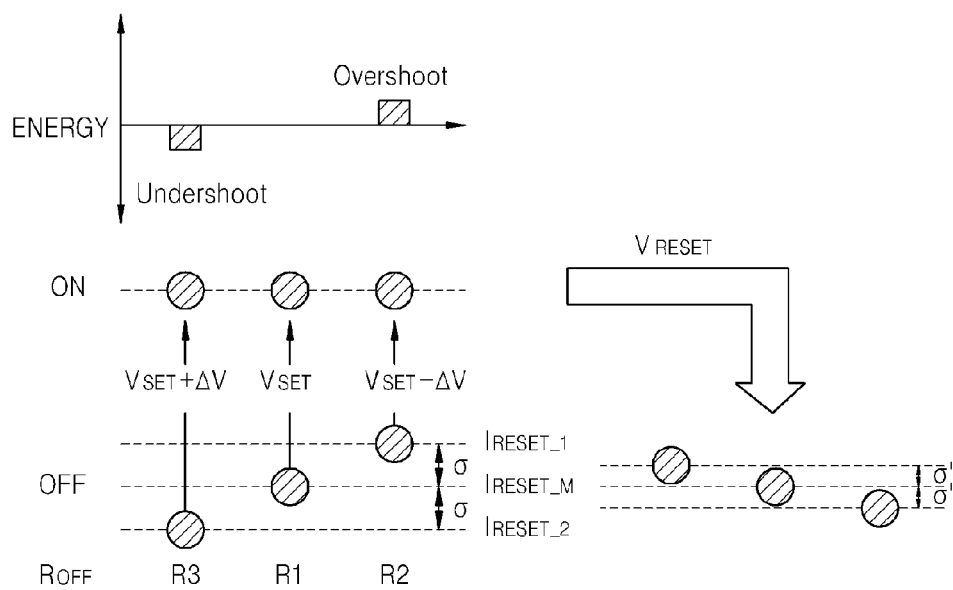
FIG. 8 is a schematic diagram for describing an operation of a variable resistance device when the operating voltages of FIG. 7 are applied thereto, according to another example embodiment.

FIG. 8 is a schematic diagram for describing an operation of the variable resistance device 10 when the operating voltages of FIG. 7 are applied thereto, according to an example embodiment.

Referring to FIG. 8, when the variable resistance device 10 is in the "off" state, the variable resistance device 10 may have the off resistance $R_{OFF}$ that may be divided into the first through the third resistances R1, R2, and R3 as shown in FIG. 3. When the variable resistance device 10 has the first resistance R1, the reset current $I_{RESET}$ flowing through the variable resistance device 10 may have an average level $I_{RESET\_M}$. When the variable resistance device 10 has the second resistance R2, the reset current $I_{RESET}$ flowing through the variable resistance device 10 may have a first level $I_{RESET\_1}$. In this regard, the first level $I_{RESET\_1}$ may be a level (e.g., $I_{RESET\_M+\sigma}$) that is higher than the average level $I_{RESET\_M}$ by a desired (or alternatively predetermined) level σ. When the variable resistance device 10 may have the third resistance R3, the reset current $I_{RESET}$ that may be flowing through the variable resistance device 10 may have a second level $I_{RESET\_2}$. In this regard, the first level $I_{RESET\_2}$ may be a level (e.g., $I_{RESET\_M-\sigma}$) lower than the average level $I_{RESET\_M}$ by the desired (or alternatively predetermined) level σ.

The set voltage $V_{SET}$ may be applied to the variable resistance device 10 in order to switch the variable resistance device 10 from the "off" state to the "on" state. The set voltage $V_{SET}$ may be variable according to a dispersion of the off resistance $R_{OFF}$ of the variable resistance device 10 as shown in FIG. 7. When the variable set voltage $V_{SET}$ may be applied to the variable resistance device 10 according to a dispersion of the off resistance $R_{OFF}$, an energy level of the variable resistance device 10 may be relatively uniform when the variable resistance device 10 may be switched to the "on" state.

More specifically, when the off resistance $R_{OFF}$ may be the second resistance R2, the reset current $I_{RESET}$ that may be flowing through the variable resistance device 10 may have the first level $I_{RESET\_1}$ that may be higher than the average level $I_{RESET\_M}$. In this regard, a set voltage $V_{SET-\Delta}$ that may be smaller by a desired (or alternatively predetermined) level $\Delta$ than the set voltage $V_{SET}$ that may be applied to the variable resistance device 1 when the off resistance $R_{OFF}$ may be the first resistance R1 may be applied to the variable resistance device 1, thereby reducing an energy surplus in the variable resistance device 10 when the variable resistance device 10 may be switched to the "on" state. Accordingly, an overshoot of energy that may be applied to the variable resistance device 10 when the variable resistance device 10 may be switched to the "on" state and the off resistance $R_{OFF}$ may be the second resistance R2 may be reduced compared to the overshoot as shown in FIG. 5.

Meanwhile, when the off resistance $R_{OFF}$ may be the third resistance R3, the reset current $I_{RESET}$ that may be flowing through the variable resistance device 10 may have the second level $I_{RESET\_2}$ lower than the average level $I_{RESET\_M}$. In this regard, a set voltage $V_{SET+\Delta}$ that may greater by the desired (or alternatively predetermined) level $\Delta$ than the set voltage $V_{SET}$ that may be applied to the variable resistance device 1 when the off resistance $R_{OFF}$ may be the first resistance R1 may be applied to the variable resistance device 1, thereby possibly reducing a lack of energy in the variable resistance device 10 when the variable resistance device 10 may be switched to the "on" state. Accordingly, an undershoot of energy, which may be applied to the variable resistance device 10 when the variable resistance device 10 may be switched to the "on" state and the off resistance $R_{OFF}$ may be the third resistance R3, may be reduced compared to the undershoot as shown in FIG. 5.

Energy necessary for forming a conductive path when the variable resistance device 10 may be switched to the "on" state may be expressed according to Equation 1 below, $$P=IV=V2/R \quad \text{[Equation 1]}$$

wherein, I may denote the set current $I_{SET}$, V may denote the set voltage $V_{SET}$, and R may denote the off resistance $R_{OFF}$. Thus, the dispersion of the off resistance $R_{OFF}$ may be offset at the set voltage $V_{SET}$ by varying or maintaining the set voltage $V_{SET}$ according to a dispersion of R, e.g., the dispersion of the off resistance $R_{OFF}$. Thus, the greater the dispersion of the off resistance $R_{OFF}$, the greater the variation of the set voltage $V_{SET}$ may be. Accordingly, the energy necessary for forming the conductive path if the variable resistance device 10 may be switched to the "on" state may be maintained relatively uniform.

Next, the reset voltage $V_{RESET}$ may be applied to the variable resistance device 10 in order to switch the variable resistance device 10 from the "on" state to the "off" state again. The reset voltage $V_{RESET}$ may have a constant value irrespective of the off resistance $R_{OFF}$ of the variable resistance device 10 as shown in FIG. 7. In this regard, the reset current $I_{RESET}$ that may be flowing through the variable resistance device 10 after the reset voltage $V_{RESET}$ may be applied to the variable resistance device 10 may have a dispersion of a level $\sigma'$ that may be reduced compared to the "off" state in a previous operation.

The set voltage $V_{SET}$ may be determined to be variable according to the dispersion of the off resistance $R_{OFF}$ in the previous operation, and the determined set voltage may be applied to the variable resistance device 10. Accordingly, although the same reset voltage $V_{RESET}$ may be applied to the variable resistance device 10 in a next operation, a dispersion of the reset current $I_{RESET}$ that may be flowing through the variable resistance device 10 may be greatly reduced compared to the "off" state in the previous operation as shown in FIG. 8.

Figure 9:
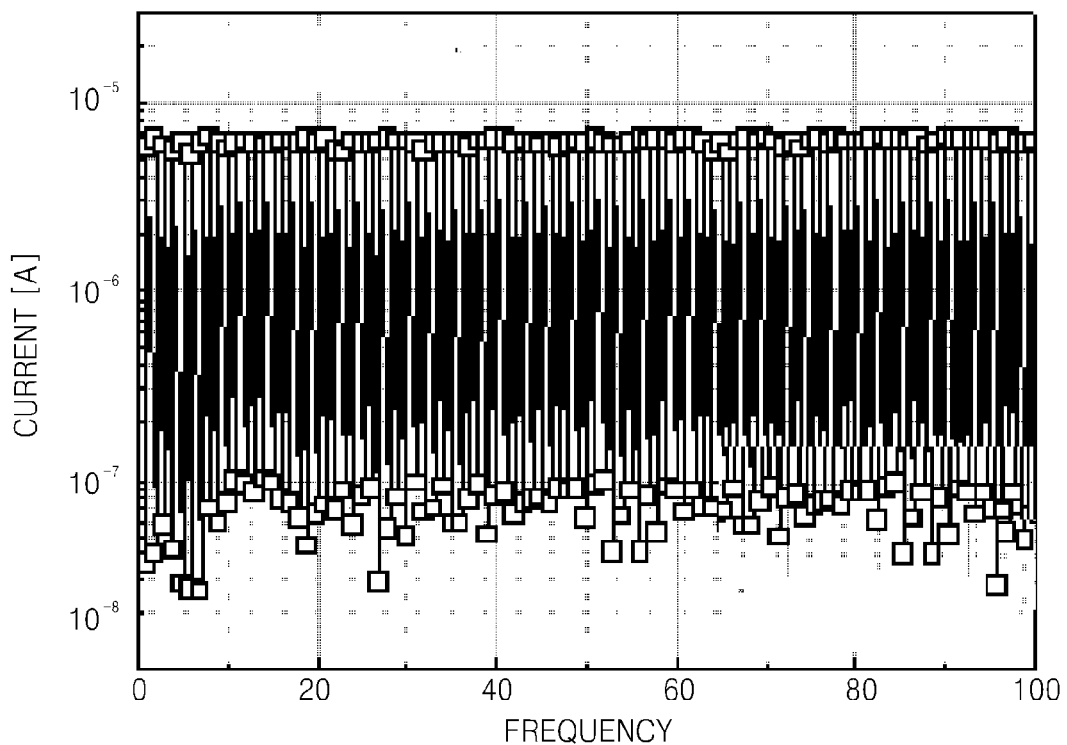
FIG. 9 is a graph showing a variation in the amount of current flowing through a variable resistance device when the operating voltages of FIG. 7 are applied thereto, according to another example embodiment.

FIG. 9 is a graph showing a variation in the amount of current flowing through a variable resistance device when the operating voltages of FIG. 7 are applied thereto, according to some example embodiments.

Referring to FIG. 9, the X-axis may denote the number of times that the set cycle or the reset cycle may be performed, and the Y-axis may denote the amount of current A. In this regard, the variable resistance material layer 12 that may be included in the variable resistance device 10 may include, for example, TaOx, the reset voltage $V_{RESET}$ may be about 4.5 V, and a pulse width of the reset voltage $V_{RESET}$ may be about 1 us. An absolute value or a pulse width of the set voltage $V_{SET}$ may be determined to be variable.

Current flowing through the variable resistance device 10 after the set cycle, e.g., current that may be sensed when the set voltage $V_{SET}$ and the read voltage $V_{SET}$ may be sequentially applied to the variable resistance device 10, may be referred to as set current $I_{SET}$. Also, current flowing through the variable resistance device 10 after the reset cycle, e.g., current that may be sensed when the reset voltage $V_{RESET}$ and the read voltage $V_{READ}$ may be sequentially applied to the variable resistance device 10, may be referred to as reset current $I_{RESET}$.

In FIG. 9, the set current $I_{SET}$ may be maintained at a constant current level of about 1.00E-5 A. That is, the set current $I_{SET}$ may be maintained at a constant current level regardless of a number of times that the set cycle may be performed. However, the reset current $I_{RESET}$ may be maintained at a current level of about 1.00E-8 to about 1.00E-7. In this case, a dispersion of the reset current $I_{RESET}$ may be greatly reduced compared to the dispersion of the reset current $I_{RESET}$ shown in FIG. 6.

Figure 10:
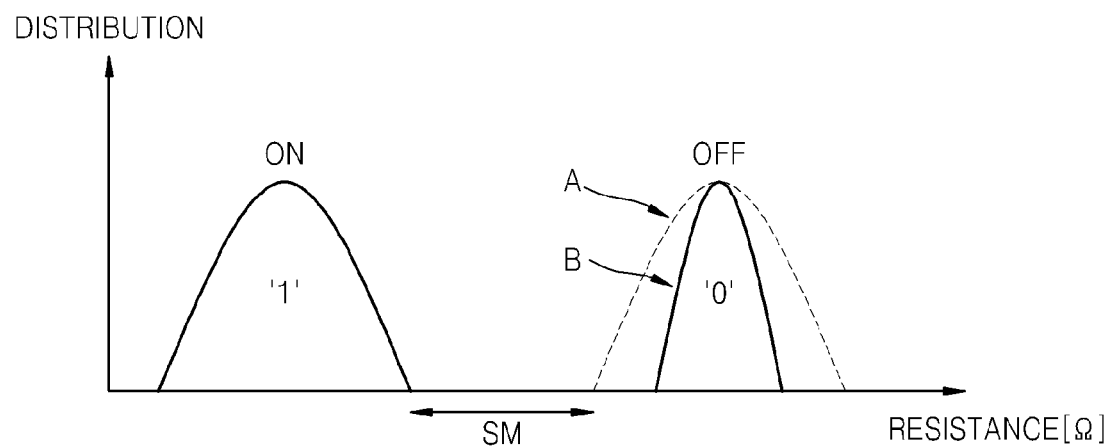
FIG. 10 is a graph showing a resistance distribution of a variable resistance device with respect to the graph of FIG. 9, according to an example embodiment.

FIG. 10 is a graph showing a resistance distribution of the variable resistance device 10 with respect to the graph of FIG. 9 according to an example embodiment.

Referring to FIG. 10, the X-axis may denote a resistance of the variable resistance device, and the Y-axis may denote the total number of resistance devices. In this regard, reference numeral A may denote a distribution of the off resistance $R_{OFF}$ according to FIGS. 4 and 5, and reference numeral B may denote a distribution of the off resistance $R_{OFF}$ according to an example embodiment, e.g., FIGS. 7 and 8.

In the present example embodiment, the set voltage $V_{SET}$ that may be determined to be variable according to the dispersion of the off resistance $R_{OFF}$ may be applied to the variable resistance device 10, which may make energy of the variable resistance device 10 relatively uniform when the variable resistance device 10 may be in an "on" state, thereby greatly reducing the dispersion of the off resistance $R_{OFF}$ when the variable resistance device 10 may be in an "off" state in a next operation.

Figure 11:
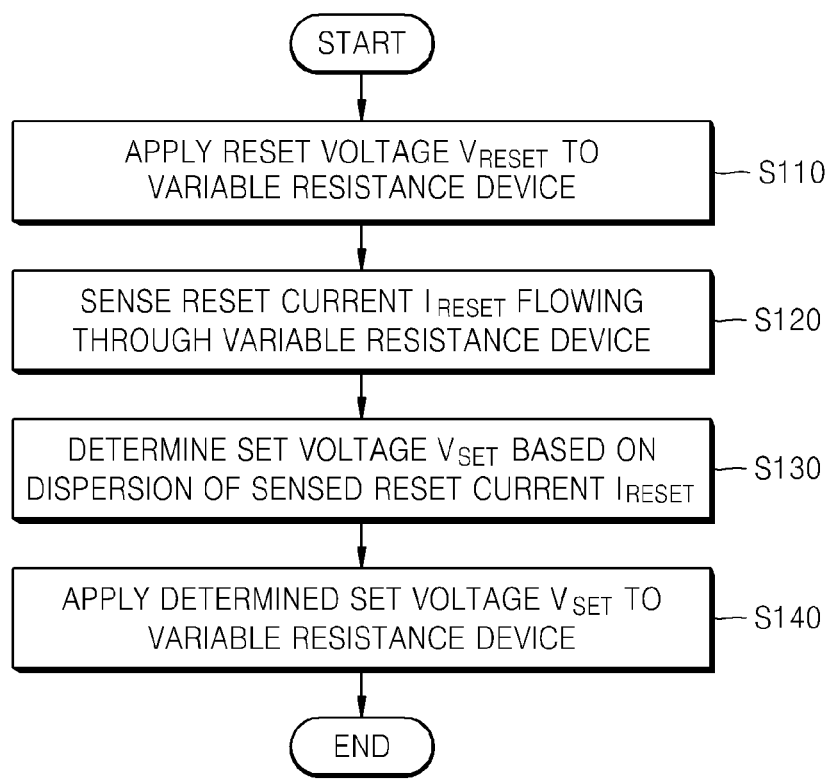
FIG. 11 is a flowchart illustrating a method of operating a semiconductor device including a variable resistance device, according to an example embodiment.

FIG. 11 is a flowchart illustrating a method of operating a semiconductor device including a variable resistance device, according to an example embodiment.

Referring to FIG. 11, the method of operating the semiconductor device of the present example embodiment may be a method of operating a semiconductor device that may include the variable resistance device 10 of FIG. 1 or the variable resistance device 10' of FIG. 2. A method according to an example embodiment will now be described, for example, in relation to the variable resistance device 10 of FIG. 1. The detailed descriptions described with reference to FIGS. 1 through 10 will apply to FIG. 11

In operation S110, the reset voltage $V_{RESET}$ may be applied to the variable resistance device 10. The variable resistance device 10 may be switched from a low resistance state to a high resistance state, e.g., the variable resistance device 10 may be switched from an "on" state to an "off" state. The reset voltage $V_{RESET}$ may be about 4.5 V.

In operation S120, the reset current $I_{RESET}$ flowing through the variable resistance device 10 to which the reset voltage $V_{RESET}$ may be applied, may be sensed. More specifically, the read voltage $V_{READ}$ that may have a smaller absolute value than the reset voltage $V_{RESET}$ may be applied to the variable resistance device 10 to which the reset voltage $V_{RESET}$ may be applied, and then the reset current $I_{RESET}$ flowing through the variable resistance device 10 may be sensed.

In operation S130, the set voltage $V_{SET}$ may be determined based on a dispersion (and/or distribution) of the sensed reset current $I_{RESET}$. More specifically, an absolute value or a pulse width of the set voltage $V_{SET}$ may be determined based on the dispersion of the sensed reset current $I_{RESET}$, e.g., a dispersion of the off resistance $R_{OFF}$ of the variable resistance device 10. This will be described in more detail with reference to FIGS. 12 and 13 below.

In operation S140, the determined set voltage $V_{SET}$ may be applied to the variable resistance device 10. Accordingly, the variable resistance device 10 may be switched from the high resistance state to the low resistance state, e.g., the variable resistance device 10 may be switched from the "off" state to the "on" state.

The method may further include sensing the set current $I_{SET}$ flowing through the variable resistance device 10 to which the set voltage $V_{SET}$ may be applied. More specifically, the read voltage $V_{READ}$ that may have a smaller absolute value than the set voltage $V_{SET}$ may be applied to the variable resistance device 10 to which the set voltage $V_{SET}$ may be applied, and then the set current $I_{SET}$ that may be flowing through the variable resistance device 10 may be sensed. Furthermore, the method may perform operation S110 again after performing operation S140.

Figure 12:
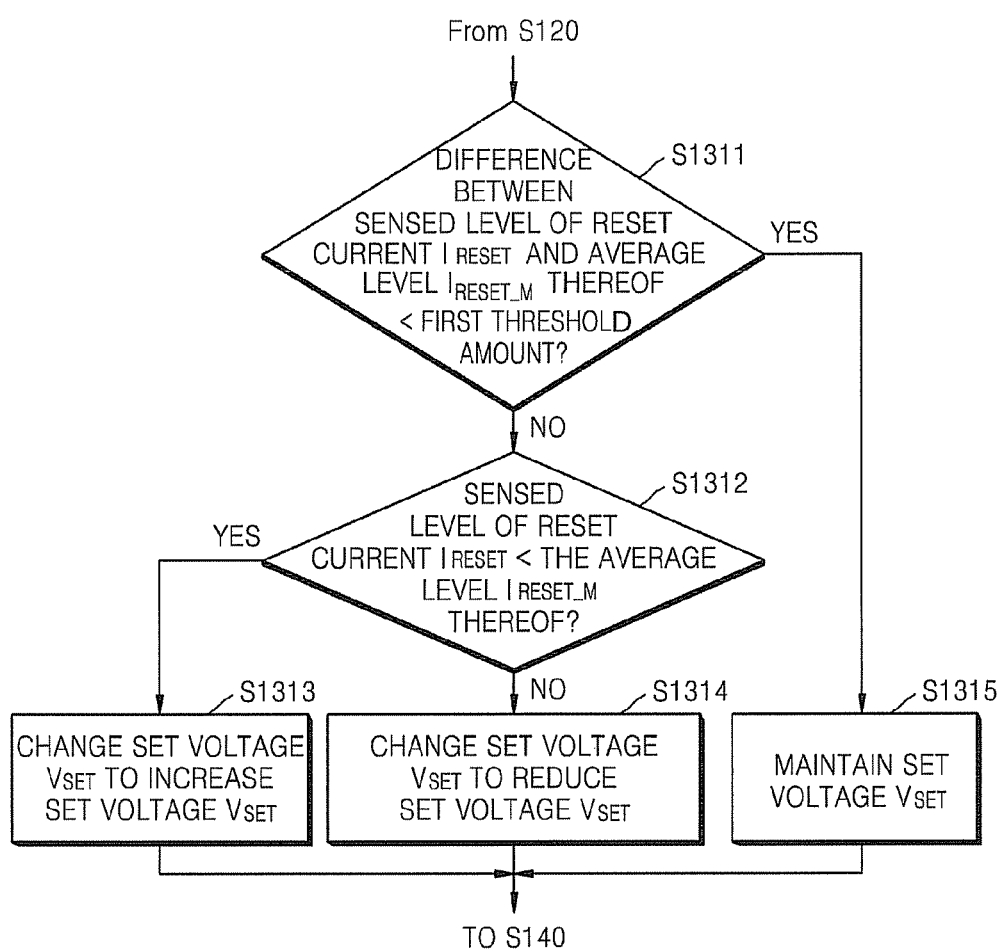
FIG. 12 is a flowchart illustrating an operation of determining a set voltage included in FIG. 11, according to an example embodiment.

FIG. 12 is a flowchart illustrating an operation of determining the set voltage $V_{SET}$ included in FIG. 11, according to an example embodiment.

Referring to FIG. 12, in operation S1311, it is determined whether a difference between the sensed level of the reset current $I_{RESET}$ and the average level $I_{RESET\_M}$ thereof is smaller than a first threshold amount. The first threshold amount may be a desired (or alternatively predetermined) range of distribution of reset current $I_{RESET}$, but example embodiments are not limited thereto. If it is determined that the difference between the sensed level of the reset current $I_{RESET}$ and the average level $I_{RESET\_M}$ thereof is smaller than the first threshold amount, operation S1315 is performed. Meanwhile, if it is determined that the difference between the sensed level of the reset current $I_{RESET}$ and the average level $I_{RESET\_M}$ thereof is greater than the first threshold amount, operation S1312 is performed. In this regard, the first threshold amount may be a desired amount and/or previously determined. More specifically, the first threshold amount may be further narrowed in order to increase the reliability of a semiconductor device.

In operation S1312, it is determined whether the sensed level of the reset current $I_{RESET}$ is smaller than the average level $I_{RESET\_M}$ thereof. If it is determined that the sensed level of the reset current $I_{RESET}$ is smaller than the average level $I_{RESET\_M}$ thereof, operation S1313 is performed. Meanwhile, if it is determined that the sensed level of the reset current $I_{RESET}$ is greater than the average level $I_{RESET\_M}$ thereof, operation S1314 is performed.

In operation S1313, the set voltage $V_{SET}$ may be changed to increase the set voltage $V_{SET}$. More specifically, if the sensed level of the reset current $I_{RESET}$ may be smaller than the average level $I_{RESET\_M}$ thereof, an energy level necessary for switching the variable resistance device 10 from an "off" state to an "on" state may be relatively large.

In operation S1314, the set voltage $V_{SET}$ may be changed to reduce the set voltage $V_{SET}$. More specifically, if the sensed level of the reset current $I_{RESET}$ may be greater than the average level $I_{RESET\_M}$ thereof, the energy level necessary for switching the variable resistance device 10 from the "off" state to the "on" state may be relatively small.

Therefore, as described with respect to operations S1313 and S1314, the set voltage $V_{SET}$ may be changed to increase or reduce the set voltage $V_{SET}$ according to a dispersion of the reset current $I_{RESET}$, and thus the energy level of the variable resistance device 10 may be relatively uniform when the variable resistance device 10 may be in the "on" state.

In operation S1315, the set voltage $V_{SET}$ is maintained. More specifically, if the difference between the sensed level of the reset current $I_{RESET}$ and the average level $I_{RESET\_M}$ thereof is smaller than the first threshold amount, since it is unnecessary to change the set voltage $V_{SET}$, the set voltage $V_{SET}$ is maintained. The first threshold amount may be a desired (or alternatively predetermined) range of distribution of reset current $I_{RESET}$.

Figure 13:
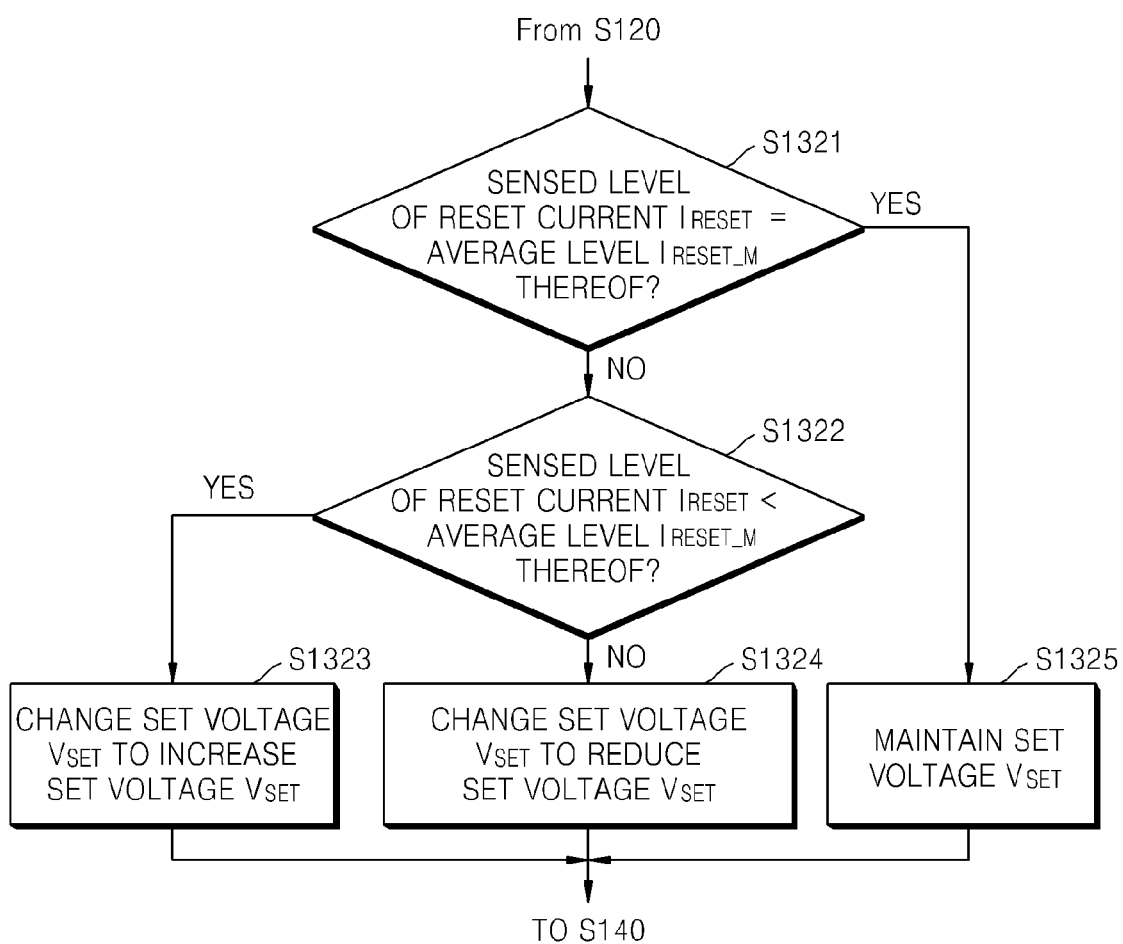
FIG. 13 is a flowchart illustrating an operation of determining a set voltage included in FIG. 11, according to another example embodiment.

FIG. 13 is a flowchart illustrating an operation of determining a set voltage included in FIG. 11, according to another example embodiment.

Referring to FIG. 13, in operation S1321, it is determined whether the sensed level of the reset current $I_{RESET}$ is substantially equal to the average level $I_{RESET\_M}$ thereof. If it is determined that the sensed level of the reset current $I_{RESET}$ is substantially equal to the average level $I_{RESET\_M}$ thereof, operation S1325 is performed. Meanwhile, if it is determined that the sensed level of the reset current $I_{RESET}$ may not be substantially equal to the average level $I_{RESET\_M}$ thereof, operation S1322 may be performed.

In operation S1322, it may be determined whether the sensed level of the reset current $I_{RESET}$ may be smaller than the average level $I_{RESET\_M}$ thereof. If it may be determined that the sensed level of the reset current $I_{RESET}$ may be smaller than the average level $I_{RESET\_M}$ thereof, operation S1323 is performed. Meanwhile, if it may be determined that the sensed level of the reset current $I_{RESET}$ may be greater than the average level $I_{RESET\_M}$ thereof, operation S1324 may be performed.

In operation S1323, the set voltage $V_{SET}$ may be changed to increase the set voltage $V_{SET}$. More specifically, if the sensed level of the reset current $I_{RESET}$ may be smaller than the average level $I_{RESET\_M}$ thereof, an energy level necessary for switching the variable resistance device 10 from an "off" state to an "on" state may be relatively large.

In operation S1324, the set voltage $V_{SET}$ may be changed to reduce the set voltage $V_{SET}$. More specifically, if the sensed level of the reset current $I_{RESET}$ may be greater than the average level $I_{RESET\_M}$ thereof, the energy level necessary for switching the variable resistance device 10 from the "off" state to the "on" state may be relatively small.

Therefore, as described in operations S1323 and S1324, the set voltage $V_{SET}$ may be changed to increase or reduce the set voltage $V_{SET}$ according to a dispersion of the reset current $I_{RESET}$, and thus the energy level of the variable resistance device 10 may be relatively uniform when the variable resistance device 10 may be in the "on" state.

In operation S1325, the set voltage $V_{SET}$ may be maintained. More specifically, if the sensed level of the reset current $I_{RESET}$ may be substantially equal to the average level $I_{RESET\_M}$ thereof, since it may be unnecessary to change the set voltage $V_{SET}$, the set voltage $V_{SET}$ may be maintained.

Figure 14:
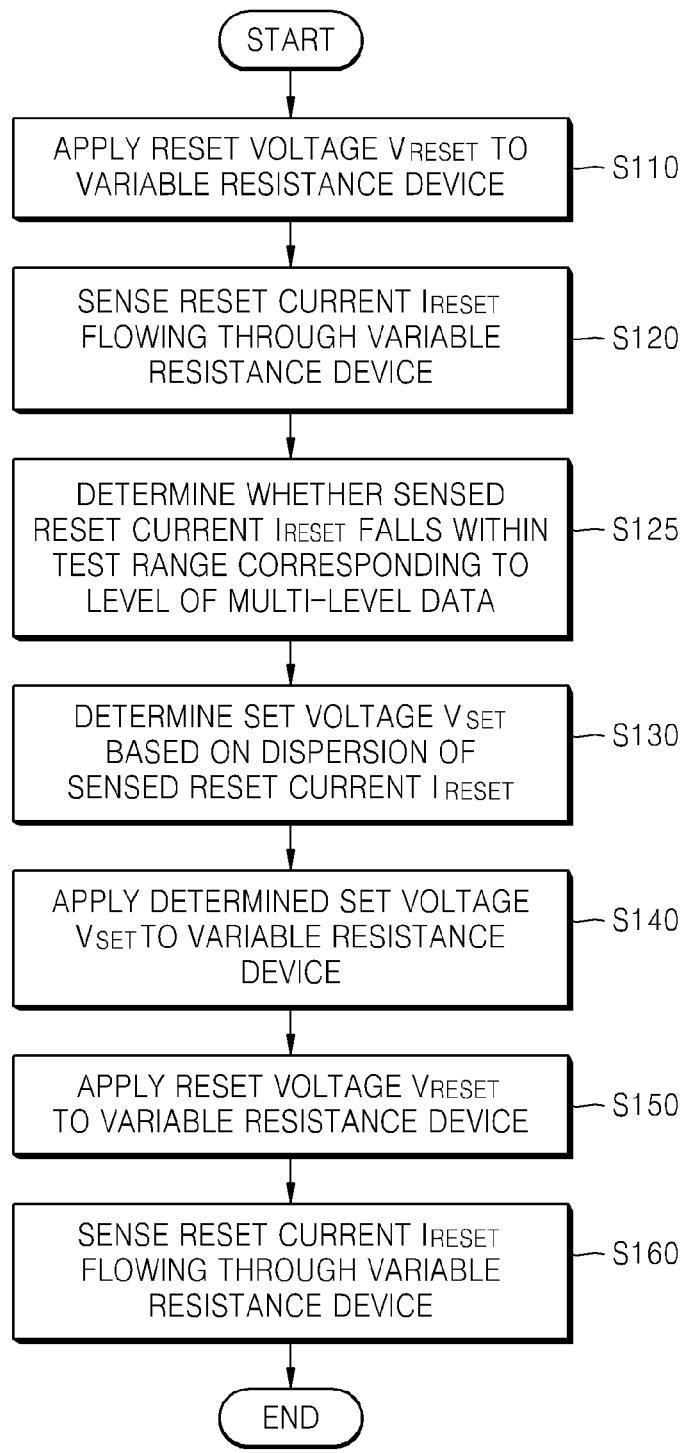
FIG. 14 is a flowchart illustrating a method of operating a semiconductor device including a variable resistance device, according to another example embodiment.

FIG. 14 is a flowchart illustrating a method of operating a semiconductor device including a variable resistance device, according to another example embodiment. The method according to an example embodiment, as shown in FIG. 14, may be a modification of the method described with reference to FIG. 11. Hereinafter, a repeated explanation will not be given.

Referring to FIG. 14, applying (operation S110) a first voltage (e.g., the reset voltage $V_{RESET}$) and sensing (operation S120) a first current (e.g., the reset current $I_{RESET}$) may be sequentially performed. In order to store multi-level data in a variable resistance device, determining (operation S125) whether the sensed reset current $I_{RESET}$ may fall within a test range corresponding to a level of the multi-level data may be performed.

Then, determining (operation S130) a second voltage (e.g., the set voltage $V_{SET}$) and applying (operation S140) the second voltage to the variable resistance device may be sequentially performed. As described above, the second voltage (e.g., the set voltage $V_{SET}$) that may be determined during operation S130 may be determined according to a dispersion of the reset current $I_{RESET}$, that is, a dispersion of an off resistance $R_{OFF}$ of the variable resistance device. In addition, the set voltage $V_{SET}$ that may be applied during operation S140 may be a modulated voltage which magnitude or pulse width may be modulated in consideration of the dispersion of the reset current $I_{RESET}$. Thus, it may be noted that the dispersion that may be considered in operation S130 may be different from the test range that may be considered in operation S125.

After a modulated $V_{SET}$ that may be modulated in operation 5140 may be applied, applying (operation 5150) the reset voltage $V_{RESET}$ to the variable resistance device may be performed. Energy of the variable resistance device may be made relatively uniform through operation S140. Thus, when the variable resistance device may be changed to an "off" state through operation S150, a dispersion of the off resistance $R_{OFF}$ may be significantly reduced.

Selectively, sensing (operation 5160) the reset current $I_{RESET}$ that may be flowing through the variable resistance device may be further performed. The reset current $I_{RESET}$ that may be sensed in operation S160 may be used to determine whether correct data (multi-level data) may be stored in the variable resistance device, and whether dispersion characteristic of data stored in the variable resistance device is satisfactory.

Figure 15:
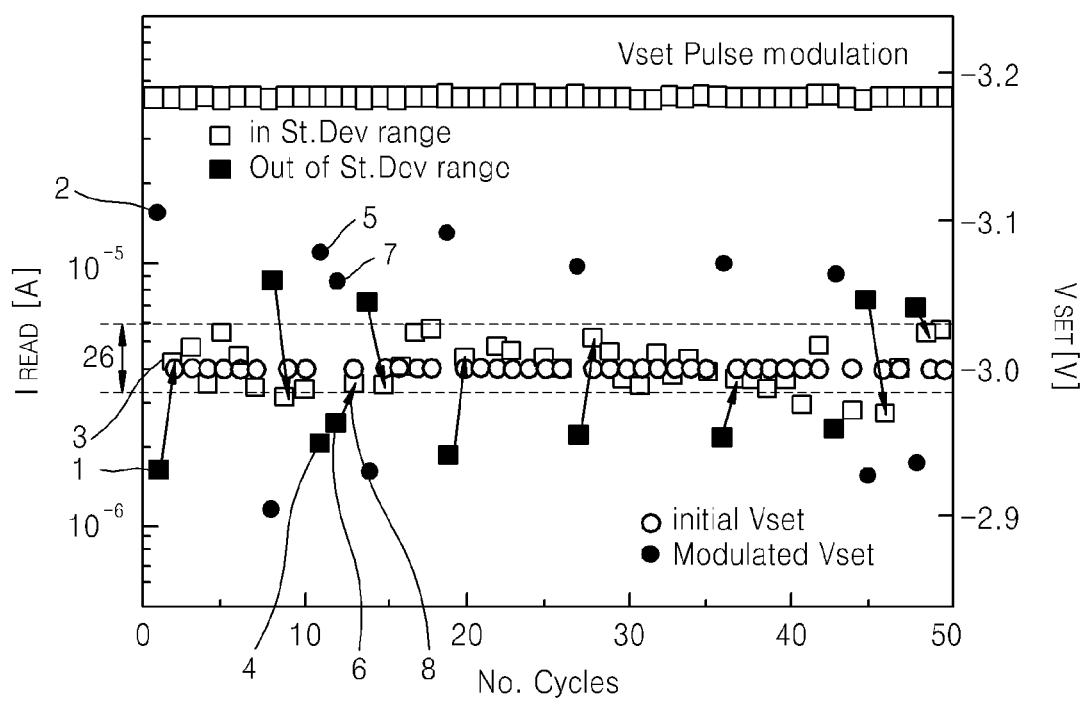
FIG. 15 is a graph illustrating an operation of storing data in a variable resistance device by using the method of FIG. 14, according to an example embodiment.

FIG. 15 is a graph illustrating an operation of storing data in a variable resistance device by using the method of FIG. 14, according to an example embodiment.

Referring to FIGS. 14 and 15, operation S110 may be performed and the variable resistance device may be changed to an "off" state. Operation S120 may be performed and the reset current $I_{RESET}$ of the variable resistance device may be sensed. The sensed reset current 1 may be about $1.5 \times 10^{-6}$ A and may not fall within a desired (or alternatively predetermined) range 26. In this case, during operation S130, the set voltage $V_{SET}$ may be adjusted from 3 V to 3.1 V. In addition, during operation S140, the adjusted set voltage 2 may be applied to the variable resistance device. Then, operation S150 may be performed. A sensed reset current 3 that may be obtained by sensing the reset current $I_{RESET}$ of the variable resistance device in operation S160 may be about $5 \times 10^{-6}$ A and falls within a desired (or alternatively predetermined) range 26. The desired (or alternatively predetermined) range 26 may correspond to $2\sigma$, 2 times the standard deviation of a desired (or alternatively predetermined) distribution for the reset current $I_{RESET}$, but example embodiments of inventive concepts are not limited thereto.

As a result of operation S160, if the reset current $I_{RESET}$ does not fall within a desired (or alternatively predetermined) range 26, operations S140, S150, and S160 may be repeated. For example, operation S110 may be performed and the variable resistance device may be changed to an "off" state. In addition, operation S120 may be performed and the reset current $I_{RESET}$ of the variable resistance device may be sensed. A sensed reset current 4 may be about $2 \times 10^{-6}$ A and may not fall within a desired (or alternatively predetermined) range 26. In this case, during operation S130, the set voltage $V_{SET}$ may be adjusted from 3 V to 3.08 V. In addition, during operation S140, an adjusted set voltage 5 may be applied to the variable resistance device. Then, operation S150 may be performed. A sensed reset current 6 that may be obtained by sensing the reset current $I_{RESET}$ of the variable resistance device in operation S160 may be about $2.5 \times 10^{-6}$ A and may not fall within a desired (or alternatively predetermined) range 26. In this case, operations S140 and S150 may be performed again and an adjusted set voltage 7 of 3.07 V may be applied to the variable resistance device again. Then, a sensed reset current 8 that may be obtained by sensing the reset current $I_{RESET}$ of the variable resistance device in operation 160 may be about $5 \times 10^{-6}$ A and may fall within a desired (or alternatively predetermined) range 26.

As a result of operations S140 and S150, the dispersion of off current of the variable device may be improved so as to increase the reliability of a semiconductor device that may include the variable resistance device.

Figure 16:
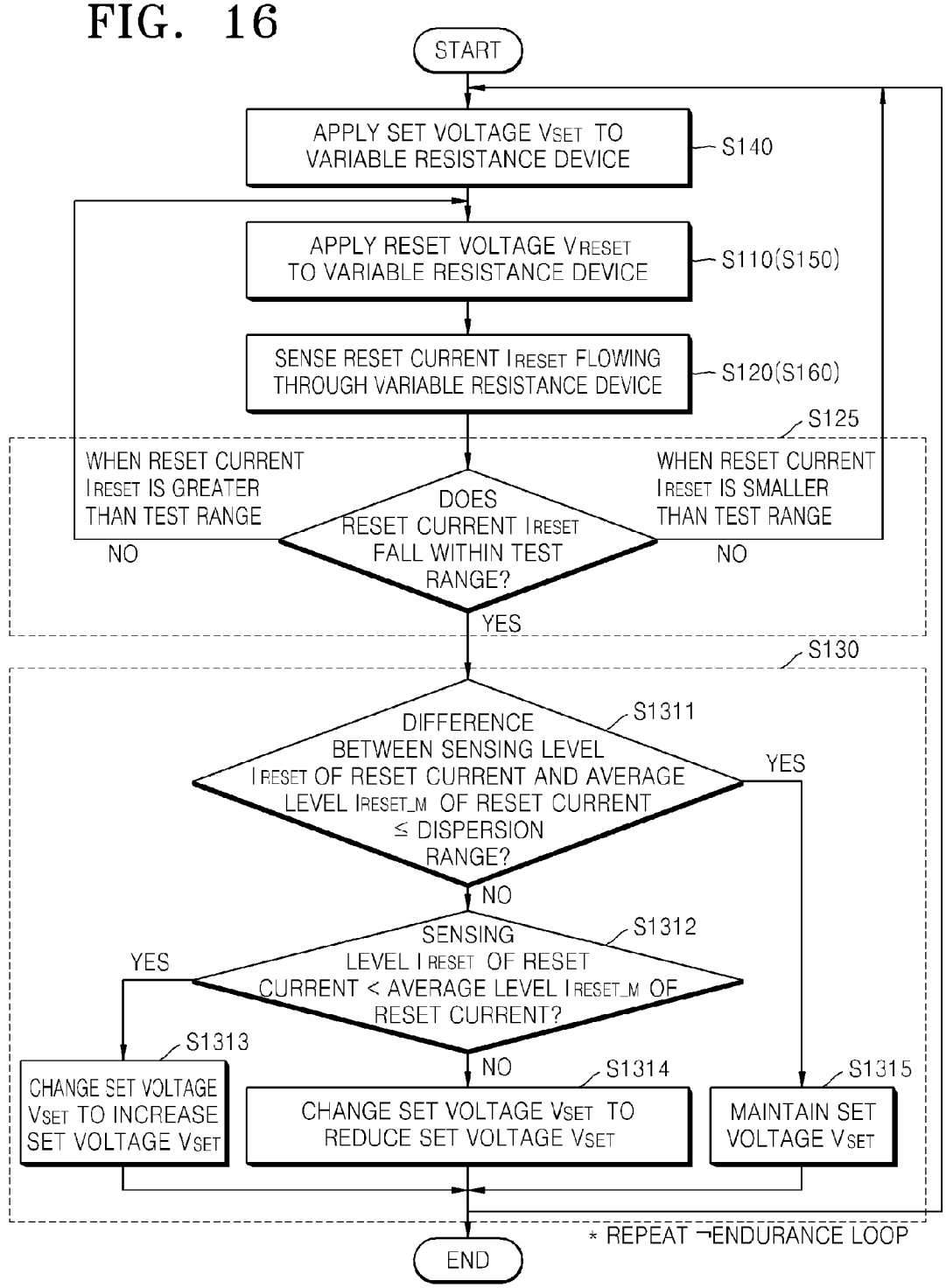
FIG. 16 is a flowchart illustrating a method of operating a semiconductor device including a variable resistance device, according to another example embodiment.

FIG. 16 is a flowchart illustrating a method of operating a semiconductor device including a variable resistance device, according to another example embodiment that may be a modification of the methods described with reference to FIGS. 11 and 12. Hereinafter, a repeated explanation of FIGS. 11 and 12 will not be given.

Referring to FIG. 16, operation S110 may be performed and the variable resistance device may be changed to an "off" state, and operation S120 may be performed and the reset current $I_{RESET}$ may be detected, as described with reference to FIG. 11. Selectively, prior to operation S110, operation S140 of applying a set voltage to the variable resistance device may be performed.

After operation S120 may be performed, determining (operation S125) whether the first current (e.g., the sensed reset current $I_{RESET}$) may fall within a test range corresponding to a level of the multi-level data may be performed. In operation S125, when the sensed first current may not fall within the test range and may be greater than the test range, operations 110, 120, and 125 may be performed again. That is, since the first current may be larger than the test range, a level of the multi-level data may not reach a desired (or alternatively predetermined) range. Thus, in order to reduce the first current flowing through the variable resistance device, the second voltage (e.g., the reset voltage $V_{RESET}$) may be applied to the variable resistance device again so that the variable resistance device may be changed to a high resistance state (e.g., a second resistance).

In operation S125, when the sensed first current (e.g., the sensed reset current $I_{RESET}$) may not fall within the test range and may be smaller than the test range, since the variable resistance device may exceed the level of the multi-level data, the variable resistance device may need to be changed from a high resistance state (e.g., a second resistance) to a low resistance state (e.g., a first resistance). Thus, operation S140 of applying the second voltage (e.g., the set voltage $V_{SET}$) for changing the variable resistance device from the second resistance to the first resistance may be performed. Then, operations 110, 120, and 125 may be sequentially performed so that the variable resistance device may be changed to a high resistance state.

As a result of operation S125, when the first current (e.g., the reset current $I_{RESET}$) falls within the test range and the resistance of the variable resistance device corresponds to the multi-level data, determining (operation S130) of the second voltage (e.g., the set voltage $V_{SET}$) that may be applied to a next loop according to a dispersion of the sensed first current may be performed. In operation S130, a dispersion of the first current (e.g., the reset current $I_{RESET}$ of the variable resistance device) may be compared with an average level of the first current. Operation S130 has been described in detail with reference to FIG. 12.

As described with reference to FIG. 12, operation S130 may include determining (operation S1311) a difference between a sensing level $I_{RESET}$ of the first current and an average level $I_{RESET\_M}$ of the first current. During operation S1311, whether the difference between the sensing level $I_{RESET}$ and the average level $I_{RESET\_M}$ of the first current may fall within a dispersion range may be determined. Then, when the difference may be greater than the dispersion range, changing (operation S1313 or S1314) of the second voltage may be performed. When the difference may be smaller than the dispersion range, maintaining (operation S1315) of the second voltage may be performed.

In particular, in operations 1313 or 1314 of changing the second voltage, when the sensing level $I_{RESET}$ may be smaller than the average level $I_{RESET\_M}$ of the first current, the second voltage may be changed to a third voltage greater than the second voltage (operation S1313). In addition, when the sensing level $I_{RESET}$ may be greater than the average level $I_{RESET\_M}$ of the first current, the second voltage may be changed to a fourth voltage smaller than the second voltage (operation S1314).

After operation S130 may be performed, in order to reprogram data, operation S140 of applying the second voltage (e.g., the set voltage $V_{SET}$) to the variable resistance device may be performed, and operation S150 of applying the first voltage (e.g., the reset voltage $V_{RESET}$) to the variable resistance device may be performed. As described with reference to FIG. 14, after operation S150 may be performed, operation S160 of sensing the first current (e.g., the reset current $I_{RESET}$) flowing through the variable resistance device may be performed. That is, in order to improve the reliability of data that may be stored in the variable resistance device, operations 110, 120, 125, 130, 140, 150, and 160 may be repeated, thereby forming an endurance loop.

Figure 17:
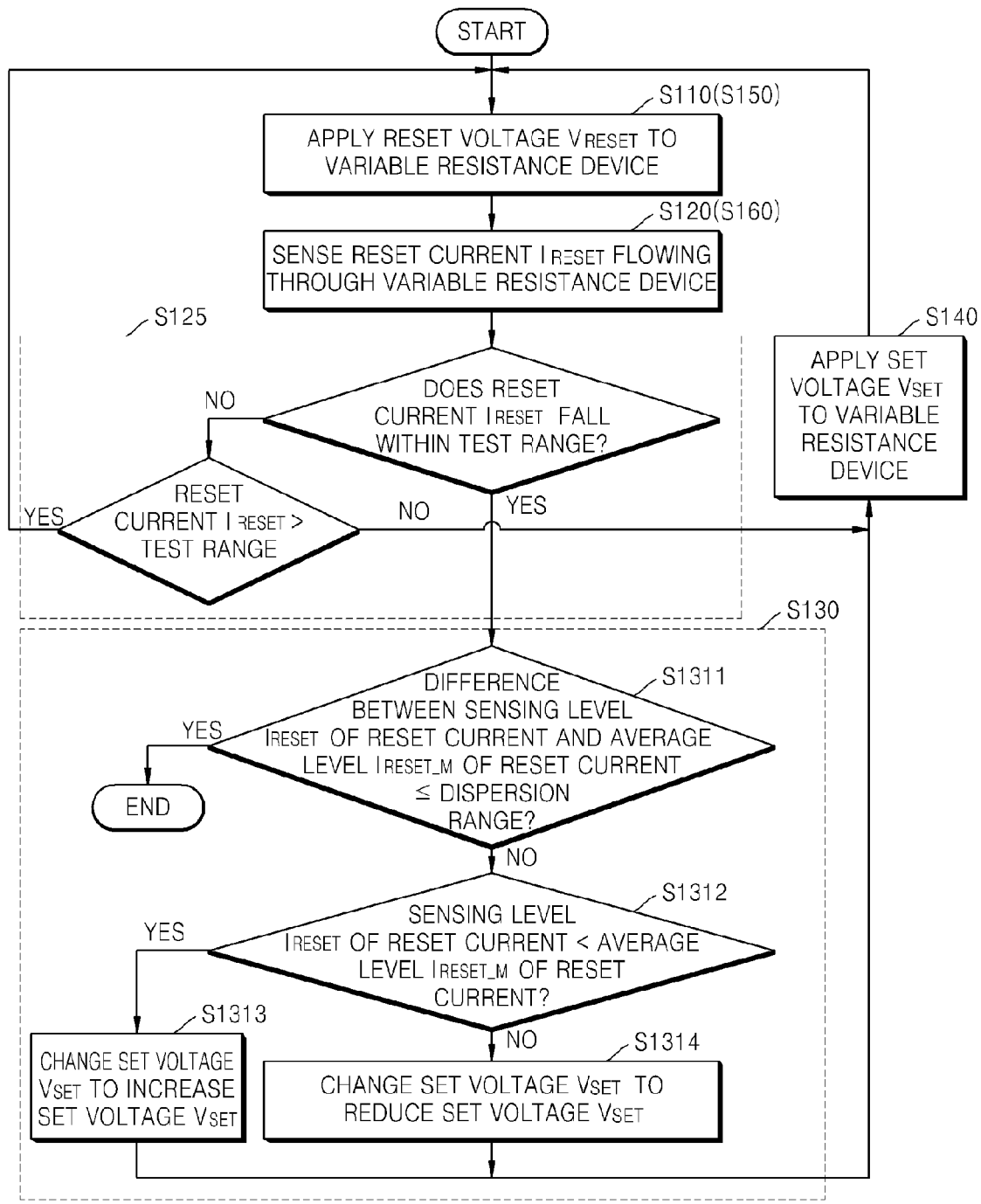
FIG. 17 is a flowchart illustrating a method of operating a semiconductor device including a variable resistance device, according to another example embodiment.

FIG. 17 is a flowchart illustrating a method of operating a semiconductor device including a variable resistance device, according to another example embodiment. The method illustrated in FIG. 17 may be a modification of the method described with reference to FIG. 16. Hereinafter, a repeated explanation will not be given.

Referring to FIG. 17, operation S130 may include determining (operation S1311) a difference between a sensing level $I_{RESET}$ of the first current and an average level $I_{RESET\_M}$ of the first current. During operation S1311, whether the difference between the sensing level $I_{RESET}$ and the average level $I_{RESET\_M}$ of the first current may fall within a dispersion range may be determined. Then, when the difference may be greater than the dispersion range, changing (operation S1313 or S1314) of the dispersion range may be performed. When the difference may be smaller than the second range, an endurance loop may be finished. In this case, a data storing completion signal may be transmitted to a controller (not shown) and thus the controller may output the data in response to a read signal.

Figure 18:
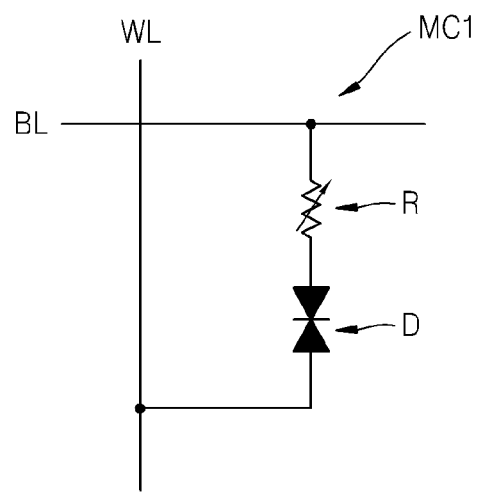
FIG. 18 is a circuit diagram of a semiconductor device that includes a variable resistance device, according to an example embodiment.

FIG. 18 is a circuit diagram of a semiconductor device that includes a variable resistance device R, according to an example embodiment.

In FIG. 18, the semiconductor device may be, for example, a non-volatile memory device, and a unit cell MC1 thereof may include the variable resistance device R and a diode D. The variable resistance device R may be substantially the same as the variable resistance device 10 of FIG. 1 or the variable resistance device 10' of FIG. 2. A first end of the variable resistance device R may be connected to a bit line BL and a second end thereof may be connected to the diode D. The diode D may operate bi-directionally, and may select the unit cell MC1 according to a voltage applied to a word line WL.

If the semiconductor device may be a single-bit non-volatile memory device, then the variable resistance device R may be switched from a low resistance state to a high resistance state and data '0' may be written to the semiconductor device when the reset voltage may be applied to the variable resistance device R, and may be switched from the high resistance state to the low resistance state and data '1' may be written to the semiconductor device when the set voltage may be applied to the variable resistance device R. In this case, a set voltage may be determined based on a dispersion of a reset current flowing through the variable resistance device R when the variable resistance device R may be in the high resistance state, e.g., based on a dispersion of an off resistance of the variable resistance device R.

Figure 19:
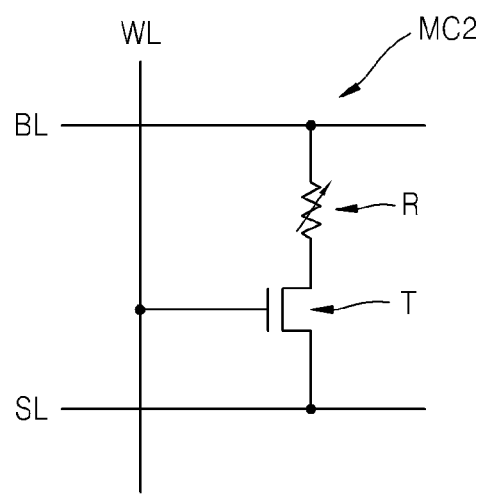
FIG. 19 is a circuit diagram of a semiconductor device that includes a variable resistance device, according to another example embodiment.

FIG. 19 is a circuit diagram of a semiconductor device that includes a variable resistance device, according to another example embodiment. Referring to FIG. 19, the semiconductor device may be, for example, a non-volatile memory device, and a unit cell MC2 thereof may include a variable resistance device R and an access transistor T. The variable resistance device R may be substantially the same as the variable resistance device 10 of FIG. 1 or the variable resistance device 10' of FIG. 2. A first end of the variable resistance device R may be connected to a bit line BL and a second end thereof may be connected to the access transistor T. The access transistor T may include a gate connected to a word line WL, a drain that may be connected to the second end of the variable resistance device R, and a source that may be connected to a source line SL. The access transistor T may be switched on or off to select the unit cell MC2, according to a voltage applied to the word line WL.

If the semiconductor device may be a single-bit non-volatile memory device, then the variable resistance device R may be switched from a low resistance state to a high resistance state and data '0' may be written to the semiconductor device when a reset voltage may be applied to the variable resistance device R, and may be switched from the high resistance state to the low resistance state and data '1' may be written to the semiconductor device when a set voltage may be applied to the variable resistance device R. In this case, the set voltage may be determined based on a dispersion of a reset current flowing through the variable resistance device R when the variable resistance device R may be in the high resistance state, e.g., based on a dispersion of an off resistance of the variable resistance device R.

Figure 20:
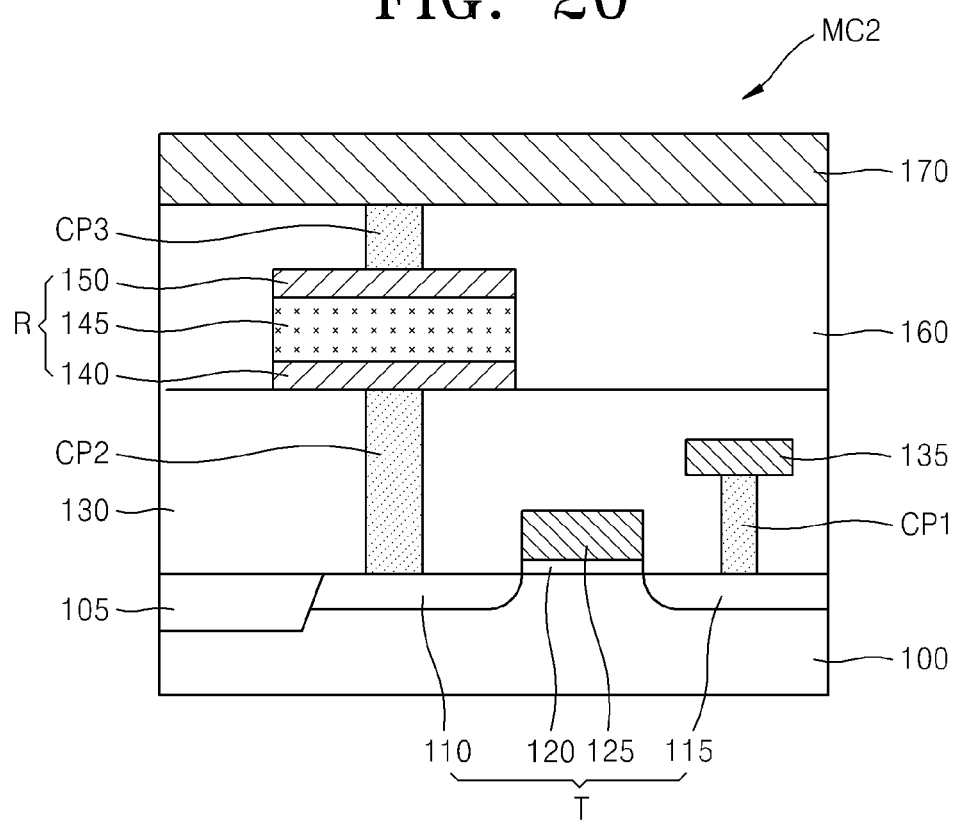
FIG. 20 is a cross-sectional diagram of the semiconductor device of FIG. 19.

FIG. 20 is a cross-sectional diagram of the semiconductor device of FIG. 19.

Referring to FIG. 20, an isolation layer 105 may be formed in a region of a semiconductor substrate 100 so as to define an active region. A drain region 110 and a source region 115 may be formed separately in the active region. A gate insulating layer 120 may be disposed on the active region between the drain region 110 and the source region 115, and a gate electrode 125 may be disposed on the gate insulating layer 120. The gate electrode 125 may extend to act as a word line or may be connected to a word line (not shown). The gate electrode 125, the drain region 110, and the source region 115 may all form an access transistor T.

A first interlayer insulating layer 130 may be formed on the access transistor T, and a first contact plug CP1 and a second contact plug CP2 may be formed in the first interlayer insulating layer 130. The source region 115 may be connected to a source line SL via the first contact plug CP1, and the drain region 110 may be connected to a lower electrode 140 via the second contact plug CP2.

A second interlayer insulating layer 160 may be formed on the first interlayer insulating layer 130, and the lower electrode 140, a variable resistance material layer 145, and an upper electrode 150 may be sequentially formed in a region of the second interlayer insulating layer 160. The upper electrode 150 may be connected to a bit line 170 via a third contact plug CP3. The lower electrode 140, the variable resistance material layer 145, and the upper electrode 150 may all form a variable resistor R. The variable resistor R may correspond to the variable resistance device 10.

Thus far, cases where variable resistance devices according to some example embodiments may be included in a single-bit non-volatile memory device have been described above in detail. However, each of the variable resistance devices may be included in a semiconductor device, such as a multi-bit non-volatile memory device.

However, a variable resistance device according to the one or more example embodiments may be included in a logic gate so as to be used in a logic circuit. In this case, the size of the logic circuit may be reduced, thereby improving the integration degree of an entire device. Particularly, a variable resistance device according to an example embodiment may be applied to a memristor. Thus, the memristor may operate substantially in a similar manner to the method of operating the semiconductor devices of FIGS. 7 through 13. Here, the "memristor" refers to a device, in which, for example, the direction and amount of current may be stored and a resistance varies according to the stored direction and amount of current.

Figure 21:
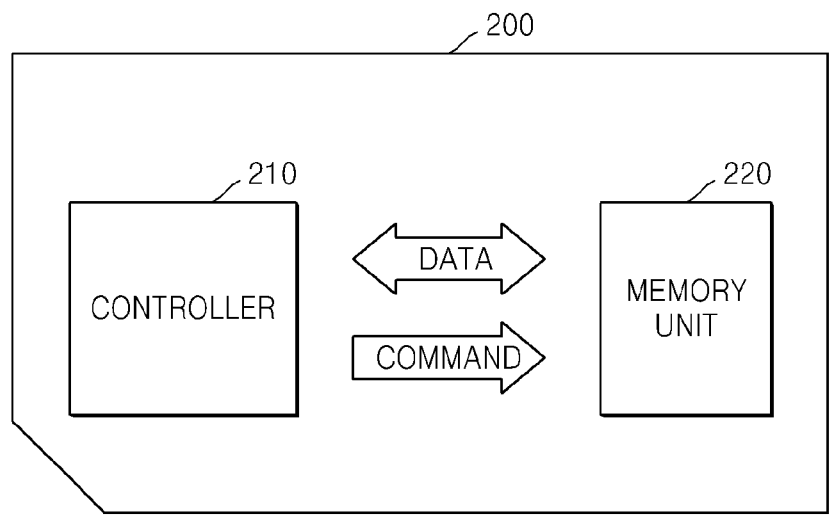
FIG. 21 is a schematic block diagram of a memory card according to an example embodiment.

FIG. 21 is a schematic block diagram of a memory card 200 according to an example embodiment. Referring to FIG. 21, the memory card 200 may include a controller 210 and a memory unit 1720. The controller 210 and the memory unit 1720 may be disposed to exchange electrical signals with each other. For example, if the controller 170 provides a command to the memory unit 1720, then the memory unit 1720 may transmit data to the controller 210. The memory unit 1720 may include a non-volatile memory device that includes a variable resistance device according to example embodiments.

The memory card 200 may be employed as a memory device including one of various types of cards, e.g., a memory stick card, a smart media (SM) card, a secure digital (SD) card, a mini SD card, and a multi-media card (MMC).

Figure 22:
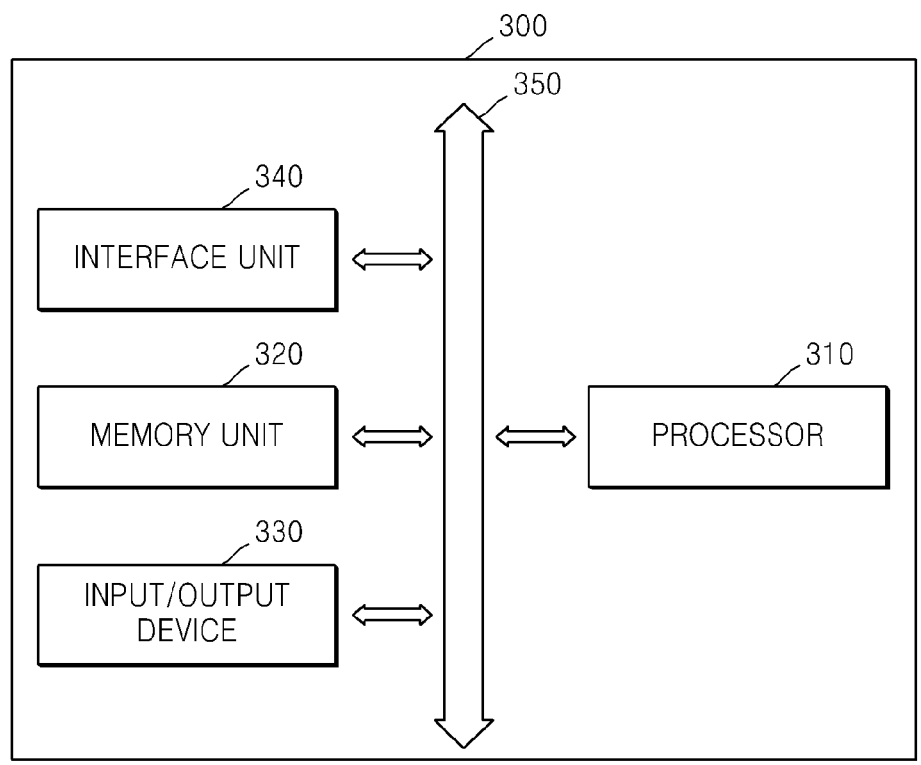
FIG. 22 is a schematic block diagram of an electronic system according to an example embodiment.

FIG. 22 is a schematic block diagram of an electronic system 300 according to an example embodiment. Referring to FIG. 22, the electronic system 300 may include a processor 310, a memory unit 320, an input/output (I/O) device 330, and an interface unit 340. The electronic system 300 may be a mobile system or a system capable of transmitting and receiving information. The mobile system may be a personal digital assistant (PDA), a portable computer, a web tablet, a wireless phone, a mobile phone, a digital music player, or a memory card.

The processor 310 may execute a program and may control the electronic system 300. The processor 310 may be, for example, a microprocessor, a digital signal processor, a microcontroller, or the like.

The I/O device 330 may be used to input data to or output data from the electronic system 300. The electronic system 300 may be connected to an external device (not shown) such as a personal computer (PC) or a network via the I/O device 330 so as to exchange data with the external device. The I/O device 330 may be, for example, a keypad, a keyboard, or a display.

The memory unit 320 may store code and/or data for operating the processor 310, and/or may store data processed by the processor 310. The memory unit 320 may include a non-volatile memory device that includes a variable resistance device according to example embodiments.

The interface unit 340 may be used as a path via which the electronic system 300 may exchange data with an external device (not shown). The processor 310, the memory unit 320, the I/O device 330, and the interface unit 340 may communicate with one another via a bus 350.

For example, the electronic system 300 may be employed in a mobile phone, an MP3 player, a navigator, a portable multimedia player (PMP), a solid state drive (SSD), or household appliances.

Figure 23:
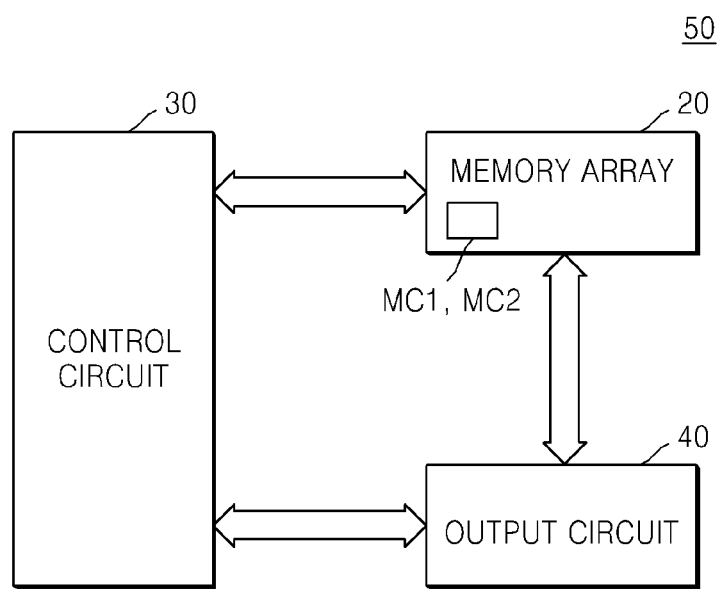
FIG. 23 is a schematic block diagram of a semiconductor device according to an example embodiment.

FIG. 23 is a schematic block diagram for a semiconductor device 50 according to an example embodiment. As shown in FIG. 23, a semiconductor device 50 includes a memory array 20, a control circuit 30, and an output circuit 40. The memory array 20 may include a plurality of unit cells MC1 and/or MC2, as shown in FIG. 18-20, but example embodiments are not limited thereto. The control circuit 30 is operatively connected to the memory array 20 and configured to sense a reset current $I_{RESET}$ and/or set current $I_{SET}$ from the variable resistance device R of unit cells MC1 and/or MC2. The control circuit 30 is configured to receive a signal indicating the current sensed from the variable resistance device R of unit cells MC1 and/or MC2, for example the reset current $I_{RESET}$ and/or set current $I_{SET}$. The control circuit 30 is configured to cause the application of a reset voltage $V_{RESET}$ and/or set voltage $V_{SET}$ to the variable resistance device R of unit cells MC1 and/or MC2, for example by causing the application of a voltage between an upper and lower electrode of the variable resistance device R in unit cells MC1 and/or MC2. Based on the reset current $I_{RESET}$ sensed, the control circuit 30 determines a set voltage $V_{SET}$ and causes the application of the set voltage $V_{SET}$ to the variable resistance device R of unit cells MC1 and/or MC2. The control circuit 30 may determine the set voltage according to the foregoing methods described in FIGS. 11-14 and 16-17, but example embodiments are not limited thereto. The output circuit 40 is operatively connected to the memory array 20 and the control circuit 30. The output circuit 40 is configured to output, for example data read from the memory array 20 under the control of the control circuit 30.

As described above, according to example embodiments, a set current of a variable resistance device that may be included in a semiconductor device may be determined based on a dispersion of the reset current, e.g., a dispersion of an off resistance of the variable resistance device, thereby improving the dispersion of an 'off' current of the variable resistance device, and accordingly improving the reliability of the semiconductor device including the variable resistance device.

According to one or more of the above example embodiments, an overshoot or an undershoot that may occur when the variable resistance device included in the semiconductor device may be switched from an "off" state to an "on" state may be reduced, thereby improving the durability of the semiconductor device.

While some example embodiments have been particularly shown and described, it will be understood by one of ordinary skill in the art that variations in form and detail may be made therein without departing from the spirit and scope of the claims.

What is claimed is:

1. A method of operating a semiconductor device including a variable resistance device, the method comprising:
   a first operation of applying a first voltage to the variable resistance device to change a resistance value of the variable resistance device from a first resistance value to a second resistance value,
      the second resistance value being different from the first resistance value;
   a second operation of sensing a first current flowing through the variable resistance device to which the first voltage is applied;
   a third operation of determining whether the first current falls within a test range corresponding to a level of multi-level data;
   a fourth operation of, when the first current falls within the test range, determining a second voltage used to change the resistance value of the variable resistance device from the second resistance value to the first resistance value based on a dispersion of the sensed first current;
   a fifth operation of applying the second voltage to the variable resistance device; and
   a sixth operation of repeating the applying the first voltage to the variable resistance device to which the second voltage is applied.

2. The method of claim 1, wherein the second resistance value is greater than the first resistance value.

3. The method of claim 1, wherein the first resistance value is a set resistance and the second resistance value is a reset resistance.

4. The method of claim 1, wherein the second operation includes:
   applying a read voltage to the variable resistance device before sensing the first current flowing through the variable resistance device to which the first voltage is applied,
      the read voltage having a magnitude that is smaller than a magnitude of the first voltage.

5. The method of claim 1, wherein the third operation includes:
   performing the first through third operations again when the first current is greater than the test range.

6. The method of claim 5, wherein the third operation includes:
   when the first current is smaller than the test range, applying the second voltage to the variable resistance to change the variable resistance device from the second resistance value to the first resistance value, and
   sequentially performing the first through third operations again.

7. The method of claim 1, wherein the fourth operation includes:
   comparing the dispersion of the first current with an average level of the first current.

8. The method of claim 7, wherein the fourth operation includes at least one of:
   changing the second voltage if a difference between a sensed level of the first current and the average level of the first current is greater than a dispersion range, and
   maintaining the second voltage if the difference between the sensed level of the first current and the average level of the first current is smaller than the dispersion range.

9. The method of claim 8, wherein the fourth operation includes at least one of:
   changing the second voltage to a third voltage that is greater than the second voltage if the sensed level of the first current is smaller than the average level of the first current, and
   changing the second voltage to a fourth voltage that is smaller than the second voltage if the sensed level of the first current is greater than the average level of the first current.

10. The method of claim 8, wherein the changing of the second voltage includes changing at least one of a magnitude and a pulse width of the second voltage.

11. The method of claim 7, wherein the fourth operation includes at least one of:
   changing the second voltage when a difference between a sensing level of the first current and an average level of the first current is greater than a dispersion range, and
   transmitting a data storing completion signal to a controller when the difference between the sensing level of the first current and the average level of the first current is smaller than the dispersion range.

12. The method of claim 1, wherein the fourth operation includes:
   determining the second voltage so that a variation of the second voltage increases as the dispersion of the first current increased.

13. The method of claim 1, further comprising:
   a seventh operation of sensing the first current flowing through the variable resistance device to which the first voltage is applied.

14. A method of operating a semiconductor device including a variable resistance device, the method comprising:
   applying a first voltage to the variable resistance device to change a resistance value of the variable resistance device from a first resistance value to a second resistance value,
      the second resistance value being different from the first resistance value;
   sensing first current flowing through the variable resistance device to which the first voltage is applied;
   determining a second voltage for changing the variable resistance device from the second resistance value to the first resistance value, based on a dispersion of the first current;
   applying the second voltage to the variable resistance device; and applying the first voltage to the variable resistance device to which the second voltage is applied.

15. The method of claim 14, further comprising:
determining whether the first current falls within a test range corresponding to a level of multi-level data.

16. A method of operating a semiconductor device including a variable resistance device, the method comprising:
a first operation of applying a first voltage to the variable resistance device to change a resistance value of the variable resistance device from a first resistance value to a second resistance value,
the second resistance value being different from the first resistance value;
a second operation of sensing a first current flowing through the variable resistance device to which the first voltage is applied;
a third operation of determining whether the first current falls within a test range corresponding to a level of multi-level data;
a fourth operation of,
when the first current is greater than the test range, repeating the first to third operations,
when the first current is less than the test range,
changing the resistance value of the variable resistance device to the first resistance value and repeating the first to third operations, and
when the first current falls within the test range,
determining a second voltage used to change the resistance value of the variable resistance device from the second resistance value to the first resistance value based on a dispersion of the sensed first current,
applying the second voltage to the variable resistance device; and
applying the first voltage to the variable resistance device to which the second voltage is applied.

17. The method of claim 16, wherein the second resistance value is greater than the first resistance value.

18. The method of claim 16, wherein
the first resistance value is a set resistance, and
the second resistance value is a reset resistance.

19. The method of claim 16, wherein the variable resistance device includes: a variable resistance material layer including one of a perovskite material and a transition metal oxide.

20. The method of claim 16, wherein the second operation includes:
applying a read voltage to the variable resistance device before the sensing the first current flowing through the variable resistance device to which the first voltage is applied,
the read voltage having a magnitude that is smaller than a magnitude of the first voltage.

21. The method of claim 16, wherein the variable resistance device includes:
a lower electrode;
an upper electrode; and
a variable resistance material layer between the lower electrode and the upper electrode.

22. The method of claim 16, wherein
the first voltage is a reset voltage for changing the variable resistance device to a high resistance state, and
the second voltage is a set voltage for changing the variable resistance device to a low resistance state.

23. The method of claim 16, further comprising:
a seventh operation of sensing the first current flowing through the variable resistance device to which the first voltage is applied.

24. A variable resistance device comprising:
a first electrode and a second electrode;
a variable resistance material layer between the first and second electrodes; and
a control circuit operatively connected to the variable resistance material layer, the control circuit being configured to, cause a first operation of applying a first voltage between the first and second electrodes of the variable resistance device to change a resistance value of the variable resistance device from a first resistance value to a second resistance value,
the second resistance value being different from the first resistance value,
cause a second operation of sensing a first current flowing through the variable resistance device to which the first voltage is applied,
cause a third operation of determining whether the first current falls within a test range corresponding to a level of multi-level data,
cause a fourth operation of,
when the first current does not fall within the test range, repeating the first to third operations, and
when the first current falls within the test range,
determining a second voltage used to change the resistance value of the variable resistance device from the second resistance value to the first resistance value based on a dispersion of the sensed first current,
applying the second voltage between the first and second electrodes of the variable resistance device, and
applying the first voltage to the variable resistance device to which the second voltage is applied.

25. A memory card comprising:
the semiconductor device of claim 24; and
a controller operatively connected to the semiconductor device.

26. An electronic system comprising:
the semiconductor device of claim 24;
a processor;
a bus that operatively connects the semiconductor device to the processor.

* * * * *